United States Patent
Park et al.

(10) Patent No.: US 7,537,974 B2
(45) Date of Patent: May 26, 2009

(54) PHOTORESIST COMPOSITION, METHOD FOR FORMING FILM PATTERN USING THE SAME, AND METHOD FOR MANUFACTURING THIN FILM TRANSISTOR ARRAY PANEL USING THE SAME

(75) Inventors: Jeong-Min Park, Seoul (KR); Mi-Sun Ryu, Daejeon-si (KR); Hi-Kuk Lee, Yongin-si (KR); Woo-Seok Jeon, Seoul (KR)

(73) Assignees: Samsung Electronics Co., Ltd. (KR); Samyang EMS Co., Ltd. (KR)

( * ) Notice: Subject to any disclaimer, the term of this patent is extended or adjusted under 35 U.S.C. 154(b) by 535 days.

(21) Appl. No.: 11/346,047

(22) Filed: Feb. 2, 2006

(65) Prior Publication Data
US 2006/0188808 A1     Aug. 24, 2006

(30) Foreign Application Priority Data
Feb. 3, 2005     (KR) .................. 10-2005-0010038

(51) Int. Cl.
*H01L 21/00* (2006.01)
(52) U.S. Cl. ............... 438/149; 438/151; 438/585; 438/587; 257/E21.159; 257/E21.37; 257/E21.411
(58) Field of Classification Search ............... 438/161; 257/E21.104, E21.159, E21.37, E21.372, 257/E21.416
See application file for complete search history.

(56) References Cited

U.S. PATENT DOCUMENTS

| | | | |
|---|---|---|---|
| 7,119,022 B2 * | 10/2006 | Uehara et al. ............... 438/713 |
| 7,297,452 B2 * | 11/2007 | Lee et al. ............... 430/18 |
| 2003/0059706 A1 | 3/2003 | Misumi et al. |
| 2004/0048200 A1 | 3/2004 | Ishibashi |
| 2004/0096771 A1 | 5/2004 | Kashiwagi et al. |
| 2004/0142275 A1 | 7/2004 | Komatsu |

FOREIGN PATENT DOCUMENTS

| | | |
|---|---|---|
| JP | 57047875 | 3/1982 |
| JP | 02008270 | 1/1990 |
| KR | 19960029898 | 8/1996 |
| KR | 100153335 | 7/1998 |
| KR | 1020000076997 | 12/2000 |

* cited by examiner

*Primary Examiner*—Walter L Lindsay, Jr.
*Assistant Examiner*—Cheung Lee
(74) *Attorney, Agent, or Firm*—Cantor Colburn LLP

(57) ABSTRACT

A photoresist composition includes a novolac resin having

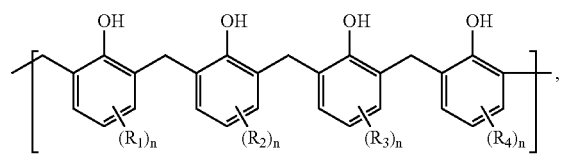

where each of $R_1$, $R_2$, $R_3$, and $R_4$ is an alkyl group having a hydrogen atom or between one through six carbon atoms and n is an integer ranging from zero through three; and a mercapto compound having $Z_1$-SH, or

SH-$Z_2$-SH, where each of $Z_1$ and $Z_2$ is an alkyl group or an alkyl group having one through twenty carbon atoms, a sensitizer, and a solvent.

19 Claims, 32 Drawing Sheets

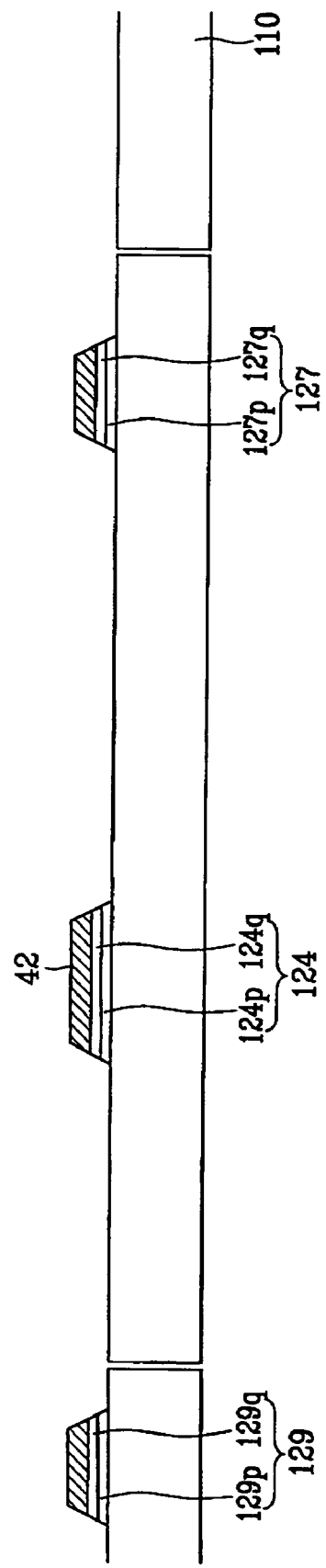

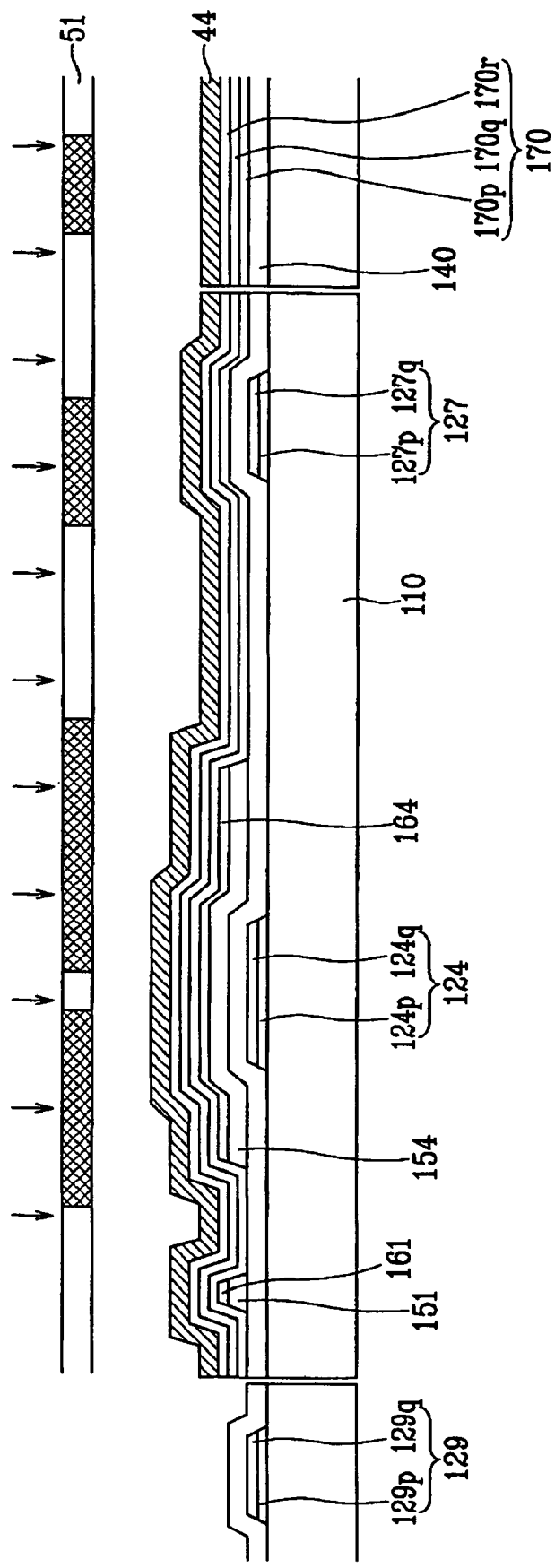

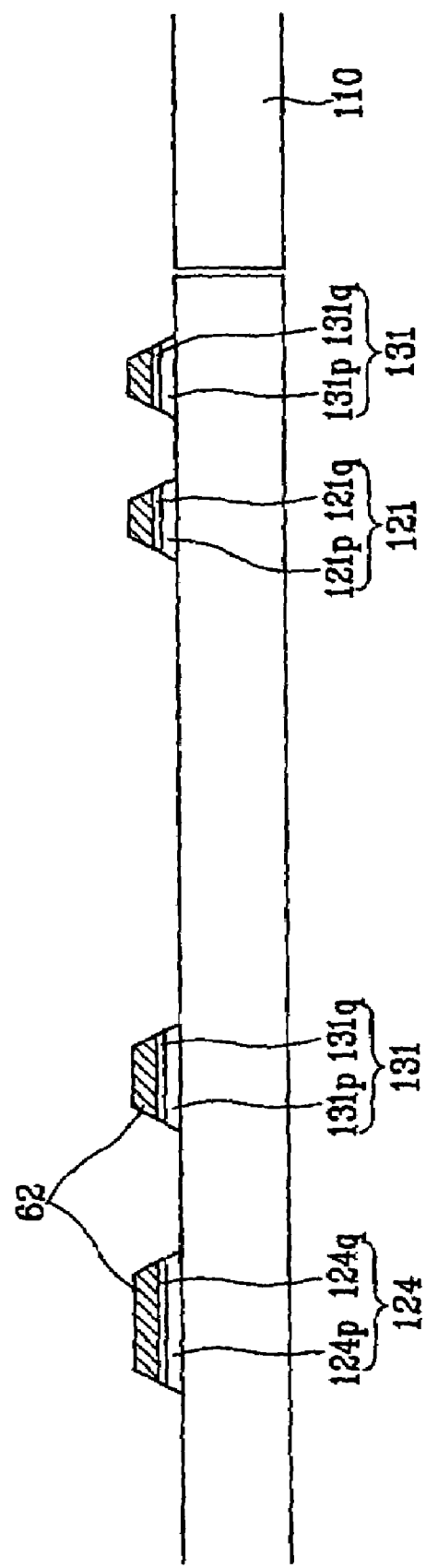

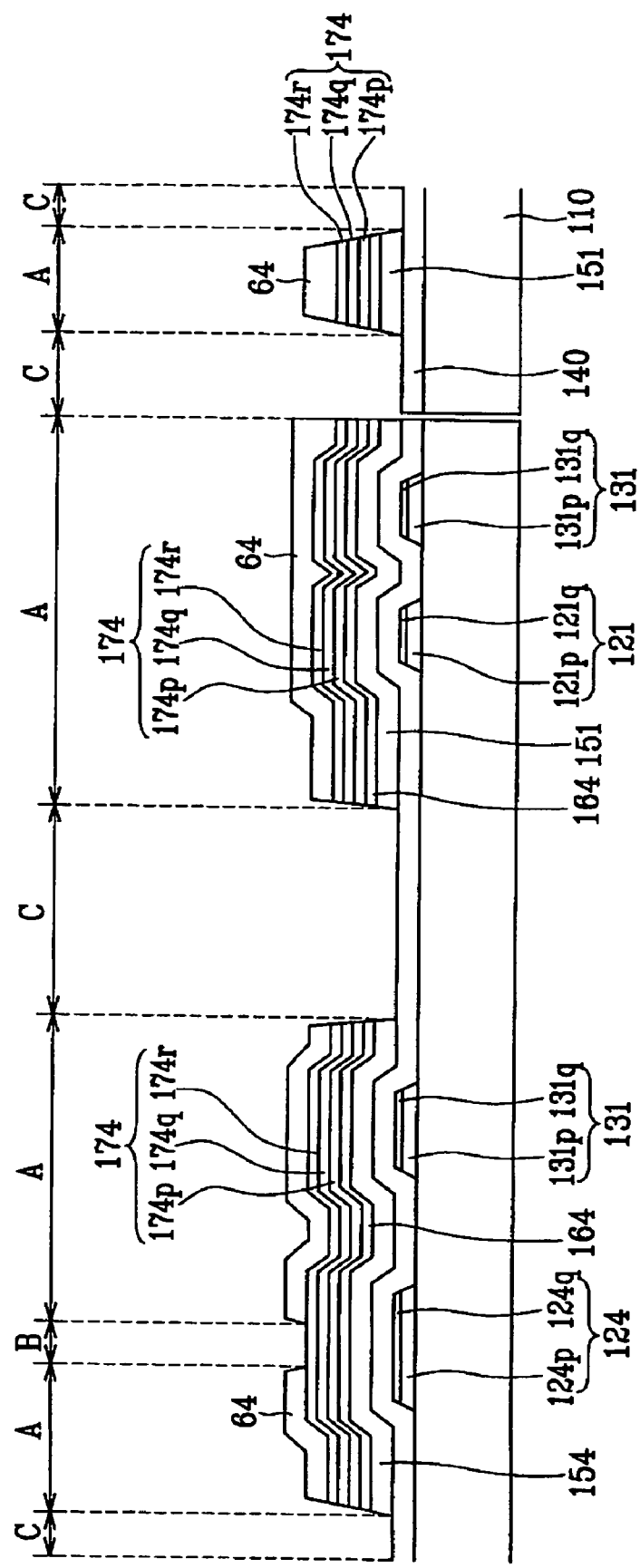

FIG.24
(A) (B)
No HB
 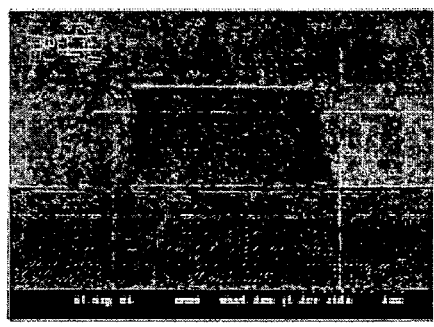
120°C
 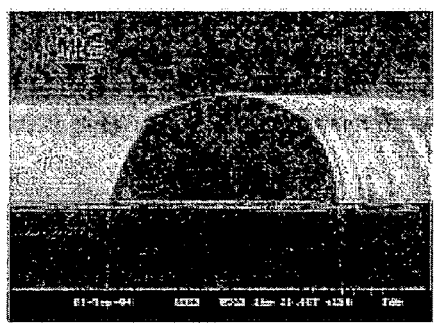
125°C
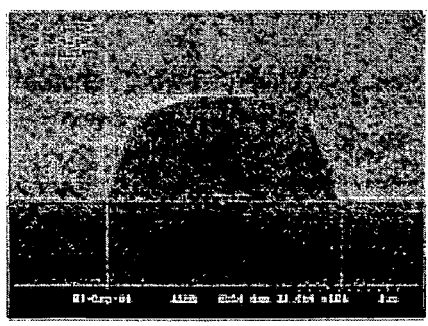 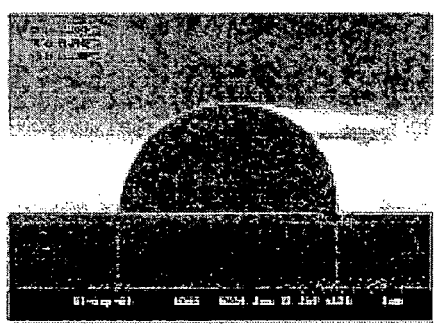
130°C
 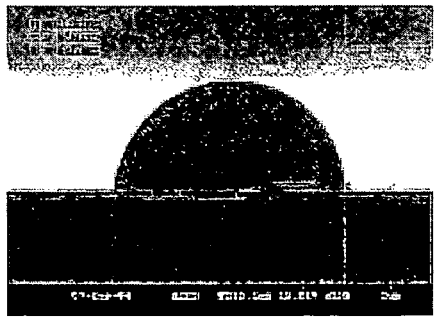

PHOTORESIST COMPOSITION, METHOD FOR FORMING FILM PATTERN USING THE SAME, AND METHOD FOR MANUFACTURING THIN FILM TRANSISTOR ARRAY PANEL USING THE SAME

CROSS REFERENCE TO RELATED APPLICATION

This application claims priority to and the benefit of Korean Patent Application No. 10-2005-0010038 filed on Feb. 3, 2005, which is hereby incorporated by reference for all purposes as if fully set forth herein.

BACKGROUND OF THE INVENTION

1. Field of the Invention

The present invention relates to a photoresist composition, a method for forming a film pattern using the same, and a method for manufacturing thin film transistor array panel using the same.

2. Description of the Related Art

An active type display device, such as an active matrix (AM) liquid crystal display (LCD) and an active matrix organic light emitting diode (OLED) display, includes a plurality of pixels arranged in a matrix having switching elements and a plurality of signal lines, such as gate lines and data lines, transmitting signals to the switching elements. The switching elements of the pixels selectively transmit data signals from the data lines to the pixels in response to gate signals received from the gate lines. The pixels of the LCD adjust transmittance of incident light and the pixels of the OLED display adjust luminance of light emission, according to the data signals.

The LCD display and the OLED display include a panel provided with the TFTs, the field-generating electrodes, the signal lines, etc. The panel has a layered structure that includes several conductive layers and insulating layers. The gate lines, the data lines, and the field-generating electrodes are formed of different conductive layers and separated by insulating layers.

The conductive layers and the insulating layers are usually patterned by a photolithography and etching procedure that includes coating, light exposure, and development of a photoresist film and wet or dry etching the layers by using the developed photoresist film.

During the wet etching, the photoresist film is exposed to an etchant. The etchant usually contains strong acids that may crack or create openings in surfaces of the photoresist film. Accordingly, portions of the layers underlying the cracks or openings may be etched out, thereby causing defects in the patterned layers.

SUMMARY OF THE INVENTION

The present invention reduces cracks in a photoresist film for patterning a conductive or insulating thin film.

Additional features of the invention will be set forth in the description which follows, and in part will be apparent from the description, or may be learned by practice of the invention.

The present invention discloses a photoresist composition including a novolac resin having

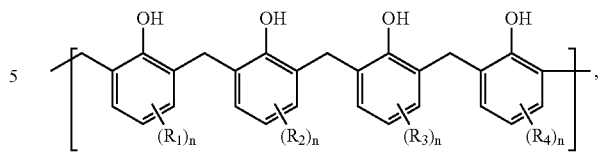

where each of $R_1$, $R_2$, $R_3$, and $R_4$ is a hydrogen atom or an alkyl group containing one through six carbon atoms and n is an integer ranging from zero through three, and a mercapto compound having $Z_1$-SH, or

SH-$Z_2$-SH, where each of $Z_1$ and $Z_2$ is an alkyl group or an allyl group containing one through twenty carbon atoms, a sensitizer, and a solvent.

The present invention also discloses a method of forming a film pattern, the method including depositing a conductive or nonconductive film on a substrate, coating a photoresist composition on the substrate, exposing the photoresist composition to light to form a masking member, and etching the thin film using the masking members, wherein the photoresist includes a novolac resin having

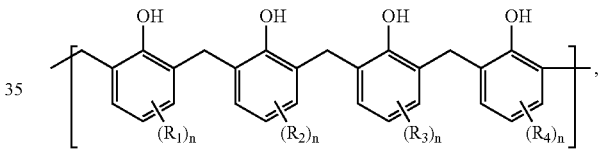

where each of $R_1$, $R_2$, $R_3$, and $R_4$ is a hydrogen atom or an alkyl group containing one through six carbon atoms and n is an integer ranging from zero through three, a mercapto compound having $Z_1$-SH, or

SH-$Z_2$-SH, where each of $Z_1$ and $Z_2$ is an alkyl group or allyl group containing one through twenty carbon atoms, a sensitizer, and a solvent.

The present invention also discloses a method of manufacturing a thin film transistor array panel, the method including forming a gate line comprising a gate electrode on a substrate, forming a gate insulating layer on the gate line, forming a semiconductor layer on the gate insulating layer, forming a data line including a source electrode and a drain electrode on the semiconductor layer, and forming a pixel electrode connected with the drain electrode, wherein at least one of the formings comprises photolithography and etching that include depositing a conductive or nonconductive film on a substrate, coating a photoresist composition on the film, exposing the photoresist composition to light and forming a masking member, and etching the thin film using the masking member, and wherein the photoresist composition includes a novolac resin having

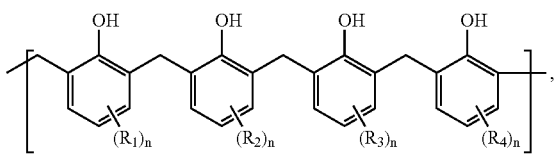

where each of $R_1$, $R_2$, $R_3$, and $R_4$ is a hydrogen atom or an alkyl group containing between one through six carbon atoms and n is an integer ranging from zero through three, a mercapto compound having $Z_1$-SH, or

SH-$Z_2$-SH, where each of $Z_1$ and $Z_2$ is an alkyl group or allyl group containing one through twenty carbon atoms, a sensitizer, and a solvent.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 5B and FIG. 6 are sectional views of the TFT array panel shown in FIG. 5A taken along line VB-VB'.

FIG. 8 and FIG. 9 are sectional views of the TFT array panel shown in FIG. 7A taken along line VIIB-VIIB' during the two successive operations following the operation shown in FIG. 7B.

FIG. 17B is a sectional view of the TFT array panel shown in FIG. 17A taken along the lines XVIIB-XVIIB'.

FIGS. 18, 19, 20, and 21 are sectional views of the TFT array panel shown in FIG. 7A taken along the lines XVIIB-XVIIB' in the two successive operations following the operation shown in FIG. 17B.

FIG. 24 shows scanning electron microscope photographs that illustrate reflow temperatures of photoresist films under hard baking.

DETAILED DESCRIPTION OF THE ILLUSTRATED EMBODIMENTS

Figure 1:
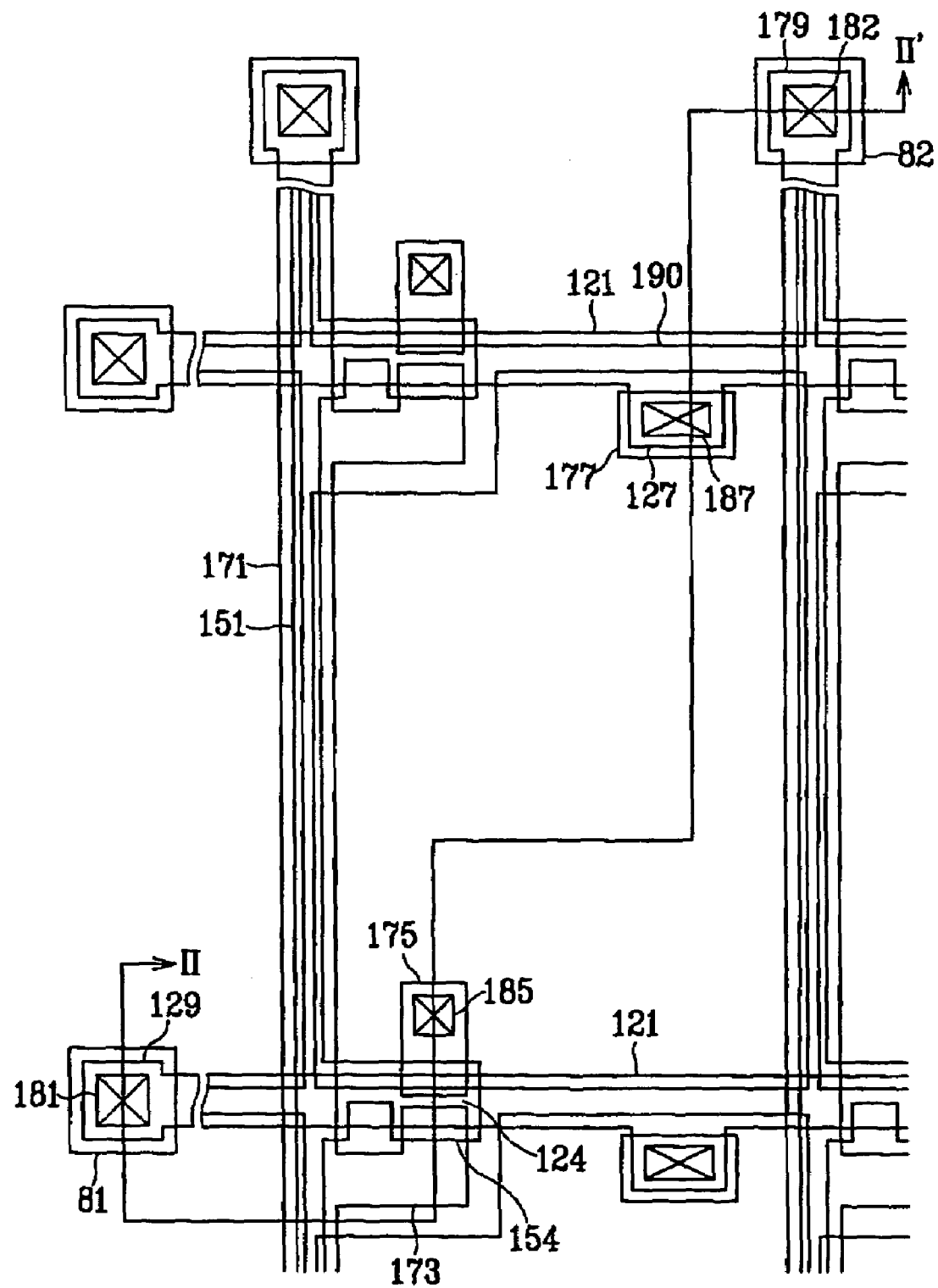
FIG. 1 is a layout view of a TFT array panel according to an embodiment of the invention.

The present invention now will be described more fully hereinafter with reference to the accompanying drawings, in which preferred embodiments of the invention are shown. The present invention may, however, be embodied in many different forms and should not be construed as limited to the embodiments set forth herein.

A photoresist composition according to the invention includes a novolac resin having Chemical Formula 1, a mercapto compound having Chemical Formula 2, a sensitizer, and a solvent.

The novolac resin may be obtained by reacting a phenol monomer and an aldehyde with an acid catalyst.

The phenol monomer may be one or more selected from a group consisting of phenol, o-cresol, m-cresol, p-cresol, o-ethyl phenol, m-ethyl phenol, p-ethyl phenol, o-butyl phenol, m-butyl phenol, p-butyl phenol, 2,3-xylene, 2,4-xylene, 2,5-xylene, 2,6-xylene, 3,4-xylene, 3,5-xylene, 3,6-xylene, 2,3,5-trimethyl phenol, 3,4,5-trimethyl phenol, p-phenyl phenol, resorcinol, hydroquinone, hydroquinone monomethyl ether, pyrogallole, chloroglucinol, hydroxy diphenyl, bisphenol-A, gallic acid, α-naphthol, and β-naphthol.

The aldehyde may be one or more selected from a group consisting of formaldehyde, p-formaldehyde, benzaldehyde, nitrobenzaldehyde, and acetaldehyde.

The acid catalyst may be one or more selected from a group of hydrochloric acid, nitric acid, sulfuric acid, formic acid, and oxalic acid.

The weight percentage of the novolac resin in the photoresist composition may range between approximately 5 through 50 wt %.

The mercapto compound may be one or more selected from a group consisting of 2-mercapto toluene, 3-mercapto toluene, 4-mercapto toluene, ethyl ester 3-mercapto propionate, methyl ester 3-mercapto propionate, 3-mercapto propyl dimethoxy methyl silane, 3-mercapto propyl trimethoxy silane, 2-mercapto ethyl sulfide, 2-mercapto pyrimidine, 2-mercapto-4-pyrimidone, 2-mercapto-para-xylene, 4-mercapto-meta-xylene, and 1-dodecyl mercaptan.

The mercapto compound may prevent a photoresist film from being cracked, split, opened, etc. (hereinafter referred to as cracked) by an etchant. Specifically, the mercapto compound may reduce the chemical attack of the etchant to the photoresist film. Thus, the mercapto compound operates as an etch-resistant additive to prevent cracks from forming in the photoresist film.

The weight percentage of the mercapto compound in the photoresist composition may range between approximately 0.5 through 15 wt %. For example, when the amount of the mercapto compound is less than approximately 0.5 wt %, the etch resistance decreases. Alternatively, when the amount of the mercapto compound is greater than 15 wt %, defect film patterns are formed because it is difficult to control the sensitized speed of the photoresist film and the boundaries between exposed portions and unexposed portions are indistinguishable.

The sensitizer in the photoresist composition reacts to the light and yields a photo-chemical reaction. The sensitizer may be selected from any type of conventional sensitizer. However, according to an embodiment of the invention, the sensitizer is selected from compounds having

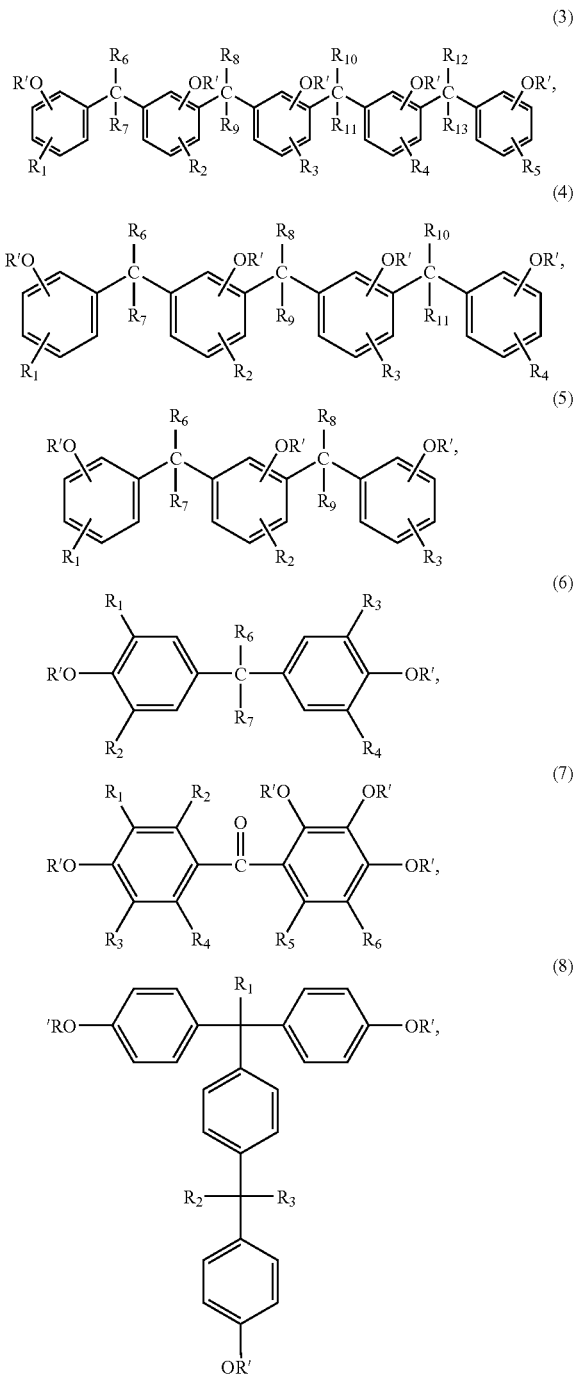

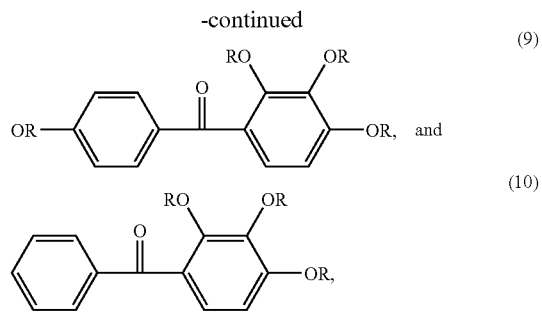

where each of R and R' is a hydrogen atom, a 2,1-diazonaphthoquinone-4-sulfonic ester, or a 2,1-diazonaphthoquinone-5-sulfonic ester. Each of $R_1$ to $R_5$ is a hydrogen atom, an alkyl group including about 1-6 carbon atoms, an alkoxy group including about 1-6 carbon atoms, or a cycloalkyl group including about 4-10 carbon atoms. Each of $R_6$, $R_8$, $R_{10}$, and $R_{12}$ is a hydrogen atom or an alkyl group including about 1-6 carbon atoms. Each of $R_7$, $R_9$, $R_{11}$, and $R_{13}$ is a hydrogen atom, an alkyl group including about 1-6 carbon atoms, an alkoxy group including about 1-6 carbon atoms, or a cycloalkyl group including about 4-10 carbon atoms.

The weight percentage of the sensitizer in the photoresist composition may range between approximately 3 through 20 wt %. For example, the sensitivity is too low when the amount of the sensitizer is less than approximately 3 wt %, and the sensitivity is too high when the amount of sensitizer is greater than approximately 20 wt %.

The photoresist composition may further include an additive, such as a silicone compound including an epoxy group or an amine group. For example, the silicone compound may include (3-glycide oxypropyl)trimethoxy silane, (3-glycide oxypropyl)triethoxy silane, (3-glycide oxypropyl)methyl dimethoxy silane, (3-glycide oxypropyl)methyl diethoxy silane, (3-glycide oxypropyl)dimethyl methoxy silane, (3-glycide oxypropyl)dimethyl ethoxy silane, 3,4-epoxy butyl trimethoxy silane, 3,4-epoxy butyl triethoxy silane, 2-(3,4-epoxy cyclohexyl)ethyl trimethoxy silane, 2-(3,4-epoxy cyclohexyl)ethyl triethoxy silane, aminopropyl trimethoxy silane, or the like. The additive improves the curing and the heat resistance properties of the photoresist composition.

The photoresist composition may further include other additives, such as a plasticizer, a stabilizer, or a surfactant.

The novolac resin, the mercapto compound, the sensitizer, and the additives may be dissolved in an organic solvent. For example, the organic solvent may include ethyl acetate, butyl acetate, diethylene glycol dimethyl ether, diethylene glycol dimethyl ethyl ether, methyl methoxy propionate, ethyl ethoxy propionate, ethyl lactate, propylene glycol methyl ether acetate, propylene glycol methyl ether, propylene glycol propyl ether, methyl cellosolve acetate, ethyl cellosolve acetate, diethylene glycol methyl acetate, diethylene glycol ethyl acetate, acetone, methyl isobutyl ketone, cyclohexanone, dimethylformamide (DMF), N,N-dimethyl acetamide (DMAC), N-methyl-2-pyrolidone, γ-butyrolactone, diethyl ether, ethylene glycol dimethyl ether, diglyme, tetrahydrofuran, methanol, ethanol, propanol, isopropanol, methyl cellosolve, ethyl cellosolve, diethylene glycol methyl ether, diethylene glycol ethyl ether, dipropylene glycol methyl ether, toluene, xylene, hexane, heptane, octane, or the like.

Embodiment 1

Formation of Photoresist Composition

A cresol mixture (Mw=8,000) including an m-cresol and a p-cresol mixed in the weight ratio of approximately 40:60 and a formaldehyde were condensation-polymerized under an oxalic acid as an acid catalyst to obtain a novolac resin.

Approximately 30 wt % of the obtained novolac resin, approximately a 10 wt % sensitizer having Chemical Formulas 9 and 10, and from approximately between 0 through 17 wt % of 1-dodecyl mercaptan were dissolved in a dimethylformamide (DMF) to obtain photoresist compositions having composition ratios shown in TABLE 1.

Photolithography and Etching

Metal patterns were formed by using the obtained photoresist compositions under substantially the same process condition.

Several glass substrates were prepared and a lower Mo film, an Al film, and an upper Mo film were sequentially deposited on each of the substrates. The photoresist compositions were spin-coated on the respective upper Mo films to form photoresist films and the photoresist films were prebaked for approximately 90 seconds at approximately 100-110° C.

The photoresist films were exposed to light using an exposer and developed by paddle development.

An etchant containing a phosphoric acid ($H_3PO_4$), a nitric acid ($HNO_3$), and an acetic acid ($CH_3COOH$) was prepared and filled in etching chambers. The substrates provided with the developed photoresist films were dipped in the etchant in the etching chambers to etch the metal films.

When a surface of the photoresist film on any of the substrates was cracked, the substrate was immediately taken out of the etchant.

For each of the substrates, it was monitored whether a crack was generated and if so, the time when the crack was generated was documented.

The etched metal films for the substrates having no crack were observed when the photoresist films thereon were removed.

The results were shown in TABLE 1.

TABLE 1

| No | Novolac Resin (Mw = 8000) | Ratio of (9) and (10) in Sensitizer | Etch Resistant Additive (1-dodecyl mercaptan) | Crack | Metal Pattern |
|---|---|---|---|---|---|
| 1 | 30 | 10:0 | 0.5-1 | ○ | — |
| 2 | 30 | 10:0 | 3 | □ | — |
| 3 | 30 | 10:0 | 5 | x | ● |
| 4 | 30 | 10:0 | 7 | x | ● |
| 5 | 30 | 10:0 | 9 | x | ● |
| CE 1 | 30 | 10:0 | 15 | x | ▲ |
| CE 2 | 30 | 10:0 | 17 | x | X |
| 6 | 30 | 5:5 | 0.5-1 | □ | — |
| 7 | 30 | 5:5 | 3 | x | ● |
| 8 | 30 | 5:5 | 5 | x | ● |
| 9 | 30 | 5:5 | 7 | x | ● |
| 10 | 30 | 5:5 | 9 | x | ● |
| CE 3 | 30 | 5:5 | 15 | x | ▲ |
| CE 4 | 30 | 5:5 | 17 | x | X |
| CE 5 | 30 | 10:0 | 0 | □ | — |
| CE 6 | 30 | 10:0 | 0.1 | □ | — |
| CE 7 | 30 | 10:0 | 0.3 | □ | — |
| CE 8 | 30 | 5:5 | 0.3 | □ | — |
| CE 9 | 30 | 5:5 | 0.4 | □ | — |

□: cracked at 60 seconds
○: cracked after 60 seconds
▯: cracked at 120 seconds
x: no crack after 180 seconds
●: reflowed at 130° C.
▲: reflowed at 125° C.
X: reflowed below 120° C.)

TABLE 1 shows that the addition of the mercapto compound significantly reduced cracks.

Specifically, for the compositions having the same amounts of the novolac resin and the sensitizer, when approximately 0 through 0.4 wt % of the mercapto compound was added amount (Comparative Examples (CE) 5-9), cracks were observed on the surfaces of the photoresist films within 60 seconds after the photoresist films were dipped in the etchant. However, when the added amount of the mercapto compound was increased from about 0.5 wt %, the etch resistance became increased such that no crack was observed after 180 seconds.

However, when the amount of the mercapto compound was greater than approximately 15 wt %, although no crack was observed, the heat resistance or the insoluble fraction of the photoresist film was degraded.

FIG. 24 shows scanning electron microscope (SEM) photographs display reflow temperatures of photoresist films under a hard baking process. (A) corresponds with the symbol ● in TABLE 1 and (B) corresponds with the symbol ▲ in TABLE 1.

Figure 25:
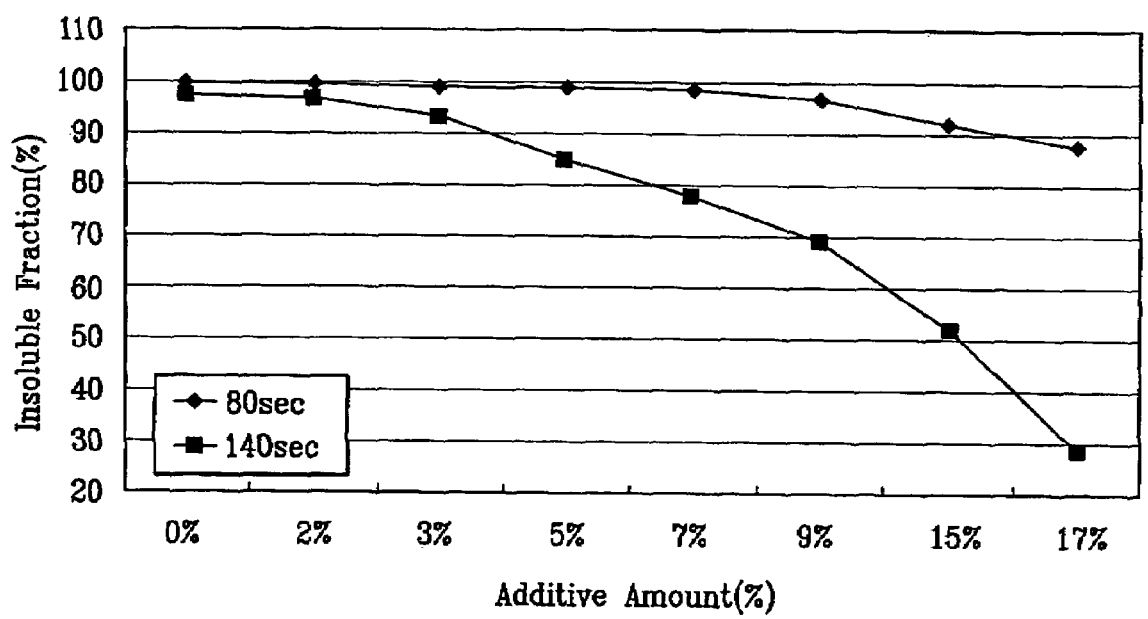
FIG. 25 is a graph illustrating insoluble fraction (%) of photoresist film as function of the amount of mercapto compound.

FIG. 25 is a graph showing an insoluble fraction (%) of photoresist film as a function of the amount of mercapto compound. The graph shows that the insoluble fraction is lower than about 50% to cause defected patterns when the amount of the mercapto compound is greater than about 15%.

Therefore, the amount of the mercapto compound may range from approximately 0.5 through 15 wt % to sustain the characteristics of the photoresist film and prevent cracks while preventing cracks from forming therein.

Embodiment 2

Thin film transistor (TFT) array panels for liquid crystal display (LCD) having an insulating layer made from the above-described photosensitive resin composition 1, and manufacturing methods thereof, are described in part with reference to accompanying drawings.

In the drawings, the thickness of layers, films and regions are exaggerated for clarity. Like numerals refer to like elements throughout. It is understood that when an element, such as a layer, film, region or substrate is referred to as being "on" another element, the etchant may be directly on the other element or intervening elements may also be present. In contrast, when an element is referred to as being "directly on" another element, no intervening elements are present.

First, a TFT array panel according to an embodiment of the invention is described with reference to FIG. 1 and FIG. 2.

Figure 2:
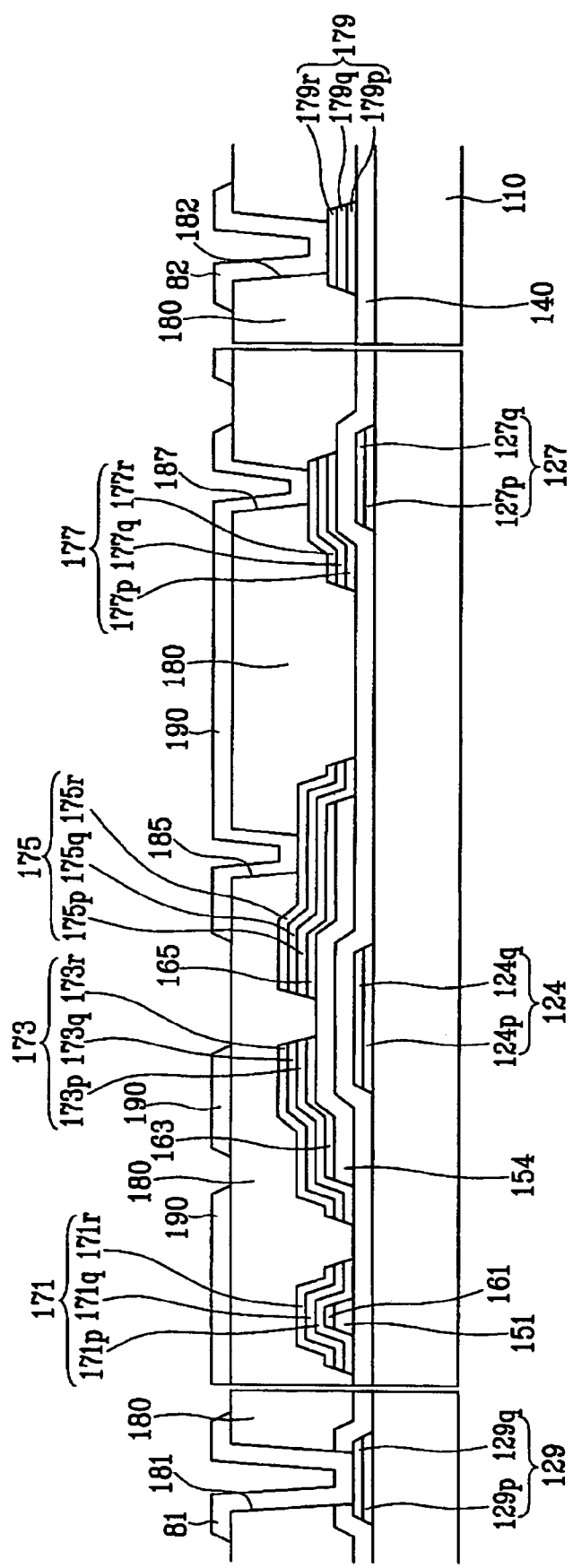
FIG. 2 is a sectional view of the TFT array panel shown in FIG. 1 taken along line II-II'.

FIG. 1 is a layout view of a TFT array panel and FIG. 2 is a sectional view of the TFT array panel shown in FIG. 1 taken along line II-II'.

A plurality of gate lines 121 are formed on an insulating substrate 110. The insulating substrate may be transparent material, such as a glass or plastic.

The gate lines 121 transmit gate signals and extend substantially in a transverse direction. Each gate line 121 includes a plurality of gate electrodes 124, a plurality of projections 127 projecting downward, and an end portion 129 having a large area for contact with another layer or an external driving circuit.

A gate driving circuit (not shown) for generating the gate signals may be provided on a flexible printed circuit (FPC) film (not shown), which may be attached to the substrate 110, directly mounted on the substrate 110, or integrated with the substrate 110. The gate lines 121 may connect with the driving circuit that may be integrated with the substrate 110.

The gate lines 121 include two conductive films, a lower film and an upper film disposed thereon, which have different physical characteristics from each other. For example, the lower film may be made of a low resistivity metal including an Al containing metal such as an Al and Al alloy, an Ag containing metal such as an Ag and Ag alloy, and a Cu containing metal such as a Cu and Cu alloy, for reducing signal delay or voltage drop. The upper film may be made of a material such as a Mo containing metal such as Mo and Mo alloy, Cr, Ta, or Ti, which has sufficient physical, chemical, and electrical contact characteristics with other materials, such as indium tin oxide (ITO) or indium zinc oxide (IZO). The combination of the two films may include a lower Al (alloy) film and an upper Mo (alloy) film.

Alternatively, it is understood that the lower film may be made of good contact material, and the upper film may be made of low resistivity material. In such a case, the upper film 129q of the end portions 129 of the gate lines 121 may be removed to expose the lower film 129p. Further, the gate lines 121 may include a single layer made of the above-described materials. The gate lines 121 are not limited to being made with the above-described materials and may be made of various metals or conductors.

In FIG. 2, the lower films and the upper films thereof are denoted by additional characters p and q, respectively, for the gate electrodes 124 and the projections 127 (124p, 124q, 127p, and 127q).

The lateral sides of the gate lines 121 are inclined relative to a surface of the substrate 110. The inclination angle of the lateral sides of the gate lines 121 relative to the surface of the substrate 110 ranges from approximately 30 to 80 degrees.

A gate insulating layer 140, which may be made of silicon nitride (SiNx) or silicon oxide (SiOx), is formed on the gate lines 121.

A plurality of semiconductor stripes 151, which may be made of hydrogenated amorphous silicon (abbreviated to "a-Si") or polysilicon, are formed on the gate insulating layer 140. Each semiconductor stripe 151 extends substantially in the longitudinal direction and widens near the gate lines 121 so the semiconductor stripes 151 cover large areas of the gate lines 121. Each semiconductor stripe 151 includes a plurality of projections 154 extending toward the gate electrodes 124.

A plurality of ohmic contact stripes and islands 161 and 165 are formed on the semiconductor stripes 151. The ohmic contact stripes and islands 161 and 165 may be made of n+ hydrogenated a-Si heavily doped with n type impurity such as phosphorous. Alternatively, the ohmic contact stripes and islands 161 and 165 may be made of silicide. Each ohmic contact stripe 161 has a plurality of projections 163. The projections 163 and the ohmic contact islands 165 are located in pairs on the projections 154 of the semiconductor stripes 151.

The lateral sides of the semiconductor stripes 151 and the ohmic contacts 161 and 165 are inclined relative to a surface of the substrate. The inclination angles thereof may range from approximately 30 to 80 degrees.

A plurality of data lines 171, a plurality of drain electrodes 175, and a plurality of storage conductors 177 may be formed on the ohmic contacts 161 and 165 and the gate insulating layer 140.

The data lines 171 transmit data signals and extend substantially in the longitudinal direction to intersect the gate lines 121. Each data line 171 includes a plurality of source electrodes 173 projecting toward the gate electrodes 124 and an end portion 179 having an area for contacting another layer or an external driving circuit.

A data driving circuit (not shown) that generates the data signals may be provided on a FPC film (not shown), which may be attached with the substrate 110, directly mounted on the substrate 110, or integrated with the substrate 110. The data lines 171 may connect with a driving circuit that may be integrated with the substrate 110.

The drain electrodes 175 are positioned separated from the data lines 171 and opposite the source electrodes 173 with respect to the gate electrodes 124.

A gate electrode 124, a source electrode 173, a drain electrode 175, and a projection 154 of a semiconductor stripe 151 form a TFT having a channel formed at the projection 154 provided between the source electrode 173 and the drain electrode 175.

The storage conductors 177 are provided on the projections 127 of the gate lines 121.

The data lines 171, the drain electrodes 175, and the storage conductors 177 may have a triple-layered structure including a lower film 171p, 175p and 177p, an intermediate film 171q, 175q and 177q, and an upper film 171r, 175r and 177r. The lower film 171p, 175p and 177p may be made of refractory metal such as Cr, Mo, Ta, Ti, or alloys thereof. The intermediate film 171q, 175q and 177q may be made of low resistivity metal, such as Al containing metal, Ag containing metal, and Cu containing metal. The upper film 171r, 175r and 177r may be made of refractory metal or alloys thereof having a sufficient contact characteristic with ITO or IZO.

The data lines 171, the drain electrodes 175, and the storage conductors 177 may have a multi-layered structure including a refractory-metal lower film (not shown) and a low-resistivity upper film (not shown). Alternatively, the data lines 171, the drain electrodes 175, and the storage conductors 177 may have a single-layer structure, which may be made of the above-described materials. However, the data lines 171, the drain electrodes 175, and the storage conductors 177 may be made of various metals or conductors.

In FIG. 2, the lower, the intermediate, and the upper films of the source electrodes 173 and the end portions 179 of the data lines 171 are denoted by additional characters p, q and r, respectively.

The data lines 171, the drain electrodes 175, and the storage conductors 177 have inclined edge profiles, and the inclination angles thereof range approximately 30-80 degrees.

The ohmic contacts 161 and 165 are only provided between the underlying semiconductor stripes 151 and the overlying conductors 171 and 175 thereon and reduce the contact resistance therebetween. Although the semiconductor stripes 151 are mostly narrower than the data lines 171, the semiconductor stripes 151 widen near the gate lines 121 as described above, to smooth the profile of the surface and prevent the data lines 171 from disconnecting.

The projections 154 of the semiconductor stripes 151 may include some exposed portions, which are not covered with the data lines 171, the drain electrodes 175, and the storage conductors 177, such as portions located between the source electrodes 173 and the drain electrodes 175.

A passivation layer 180 is formed on the data lines 171, the drain electrodes 175, the storage conductors 177, and the exposed portions of the semiconductor stripes 151. The passivation layer 180 may be made of an inorganic or an organic insulator and the passivation layer 180 may have a level surface. The inorganic insulator may include silicon nitride and/or silicon oxide. The organic insulator may be photosensitive and may have a dielectric constant that is less than approximately 4.0.

The passivation layer 180 may include a lower film of inorganic insulator and an upper film of organic insulator such that the passivation layer has excellent insulating characteristics and prevents the exposed portions of the semiconductor stripes 151 from being damaged by the organic insulator.

The passivation layer 180 has a plurality of contact holes 182, 185 and 187 exposing the end portions 179 of the data lines 171, the drain electrodes 175, and the storage conductors 177, respectively.

The passivation layer 180 and the gate insulating layer 140 have a plurality of contact holes 181 exposing the end portions 129 of the gate lines 121.

A plurality of pixel electrodes 190 and a plurality of contact assistants 81 and 82 are formed on the passivation layer 180. The plurality of pixel electrodes 190 and the plurality of contact assistants 81 and 82 may be made of a transparent conductor material, such as ITO or IZO, or a reflective conductor material, such as Ag, Al, Cr, or alloys thereof.

The pixel electrodes 190 are physically connected and coupled with the drain electrodes 175 and the storage conductors 177 through the contact holes 177 such that the pixel electrodes 190 receive data voltages from the drain electrodes 175 and transmit the data voltages to the storage conductors 177. The pixel electrodes 190 supplied with the data voltages generate electric fields in cooperation with a common electrode (not shown) of an opposing display panel (not shown) supplied with a common voltage, which determine the orientation of liquid crystal molecules (not shown) of a liquid crystal layer (not shown) provided between the two electrodes. The pixel electrode 190 and the common electrode form a capacitor referred to as a "liquid crystal capacitor," which stores applied voltages after the TFT turns off.

A pixel electrode 190 overlaps with a projection 127 of a previous gate line 121. The pixel electrode 190 and a storage conductor 177 connected thereto and the projection 127 form an additional capacitor (referred to as a storage capacitor) that increases the voltage storing capacity of the liquid crystal capacitor.

The pixel electrodes 190 overlap with the gate lines 121 and the data lines 171 to increase the aperture ratio.

The contact assistants 81 and 82 are connected with the end portions 129 of the gate lines 121 and the end portions 179 of the data lines 171 through the contact holes 181 and 182, respectively. The contact assistants 81 and 82 protect the end portions 129 and 179 and improve the adhesion between the end portions 129 and 179 and external devices.

A method for manufacturing the TFT array panel shown in FIG. 1 and FIG. 2 according to an embodiment of the invention is described below with reference to FIGS. 1 through 12B.

Figure 3:
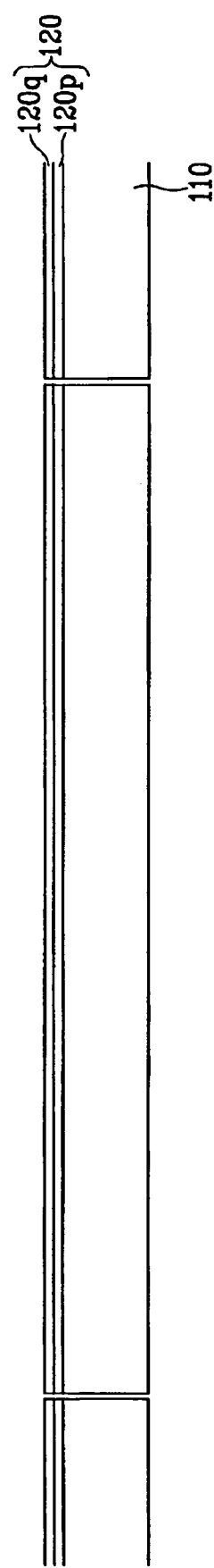
FIG. 3 and FIG. 4 are sectional views of the TFT array panel shown in FIG. 1 and FIG. 2 in first two operations of a manufacturing method thereof according to an embodiment of the invention.
Figure 4:
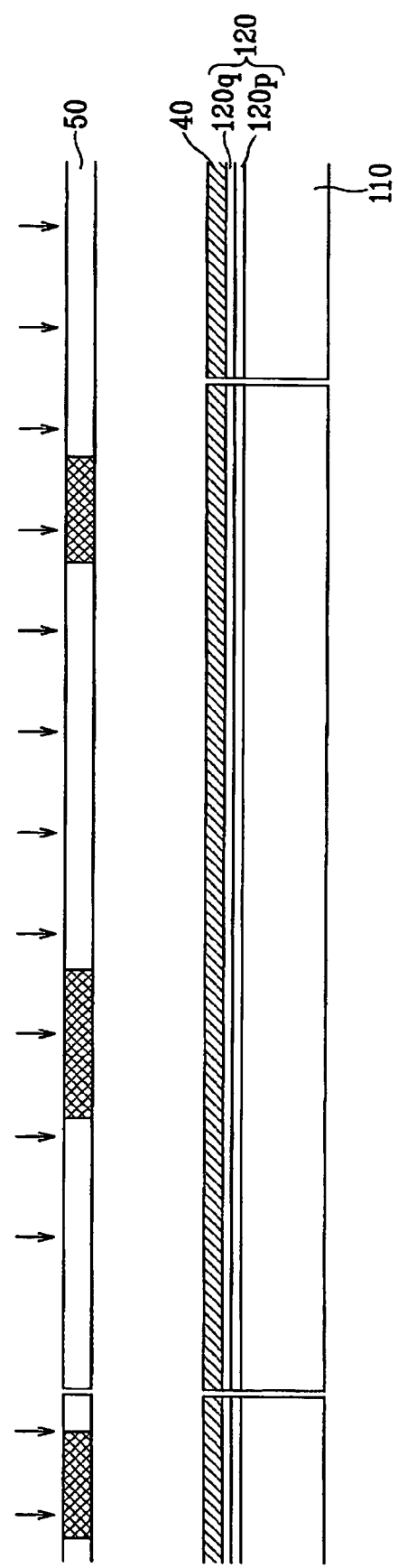

For example, FIGS. 5A, 7A, 10A and 12A are layout views of the TFT array panel shown FIG. 1 and FIG. 2 during intermediate operations of a manufacturing method thereof according to an embodiment of the invention. FIG. 3 and FIG. 4 are sectional views of the TFT array panel shown in FIG. 1 and FIG. 2 during the first two operations of the manufacturing method. FIG. 5B and FIG. 6 are sectional views of the TFT array panel shown in FIG. 5A taken along line VB-VB'. FIG. 7B is a sectional view of the TFT array panel shown in FIG. 7A taken along line VIIB-VIIB'. FIG. 8 and FIG. 9 are sectional views of the TFT array panel shown in FIG. 7A taken along line VIIB-VIIB' during the two operations following the operation shown in FIG. 7B. FIG. 10B and FIG. 11 are sectional views of the TFT array panel shown in FIG. 10A taken along line XB-XB'. FIG. 12B is a sectional view of the TFT array panel shown in FIG. 12A taken along line XIIB-XIIB'.

Referring to FIG. 3, a conductive layer 120 is deposited on an insulating substrate 110 by, for example, sputtering, etc. The conductive layer 120 includes a lower film 120$p$, which may be made of Al or Al—Nd alloy and may be approximately 2,500 Å thick, and an upper film 120$q$, which may be made of Mo.

The lower film 120$p$ and the upper film 120$q$ may be sputtered together using an Al or Al—Nd target and a Mo target. When the lower film 120$p$ is deposited, the Al(—Nd) target is powered, while the Mo target is not powered. After the lower film 120$p$ is deposited, the Al(—Nd) target is not powered and the Mo target is powered to deposit the upper film 120$q$.

Referring to FIG. 4, a photoresist film 40 may be spin-coated on the upper film 120$q$. The photoresist film 40 may be made of a photoresist composition that includes a novolac resin having

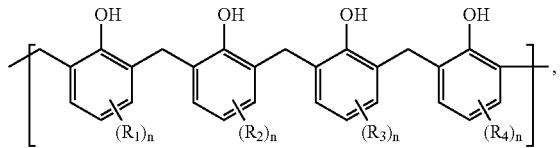

where each of $R_1$, $R_2$, $R_3$, and $R_4$ is a hydrogen atom or an alkyl group containing approximately one to six carbon atoms and n is an integer ranging from zero to three. The photoresist composition further includes a mercapto compound having the following structure:

$Z_1$-SH, or

SH-$Z_2$-SH, where each of $Z_1$ and $Z_2$ is an alkyl group or allyl group containing approximately one to twenty carbon atoms. The photoresist composition further includes a sensitizer, and a solvent.

In the photoresist composition, the weight percentage of the novolac resin may range from approximately 5 to 50 wt %. The weight percentage of the sensitizer may range from approximately 3 to 20 wt %. The weight percentage of the mercapto compound may range from approximately 0.5 to 15 wt %. The remaining portion of the composition may be the solvent.

Referring to FIG. 4, the photoresist film 40 may be exposed to light through the mask 50.

Figure 5A:
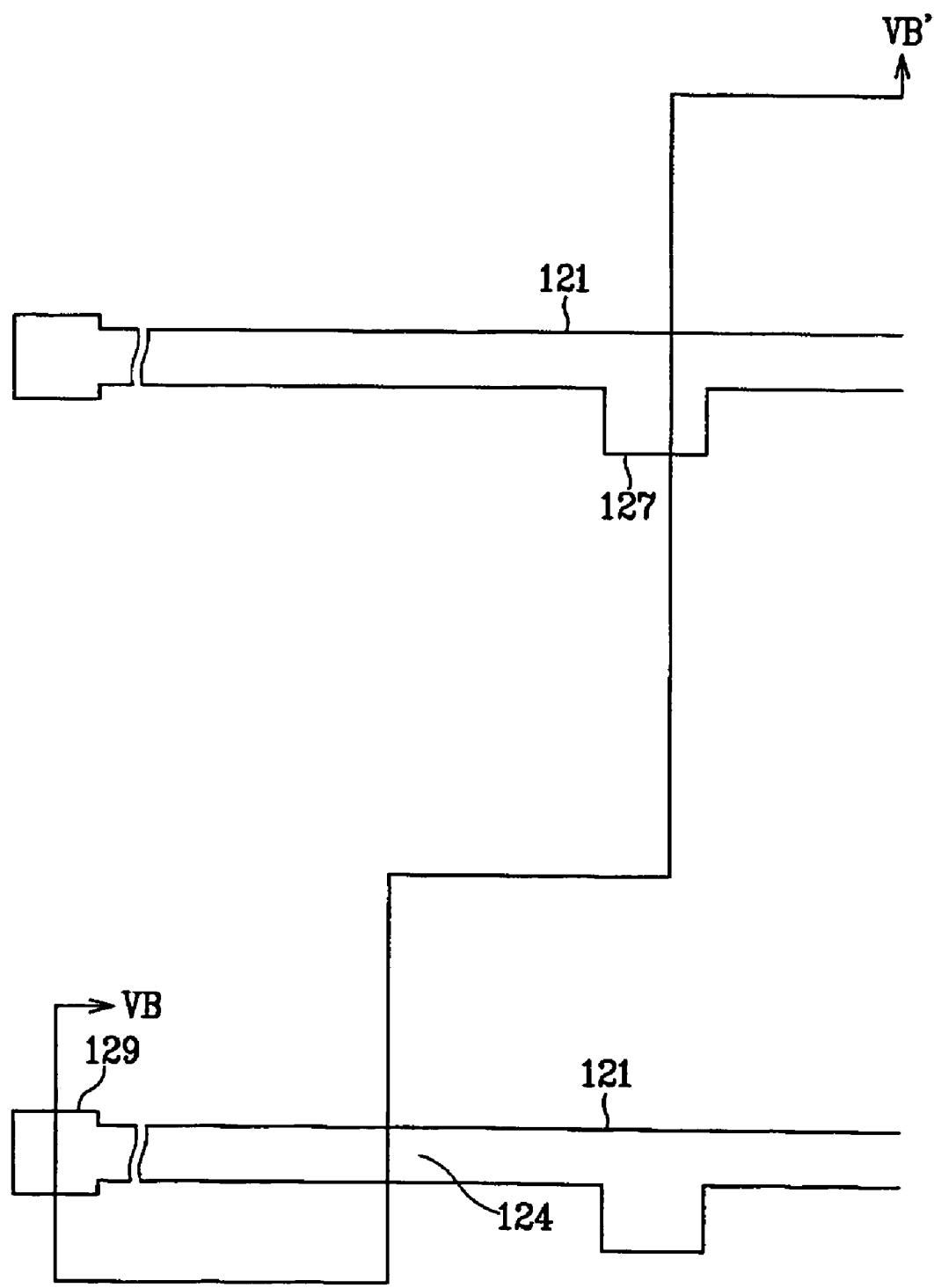
FIGS. 5A, 7A, 10A, and 12A are layout views of the TFT array panel shown FIG. 1 and FIG. 2 in intermediate operations of the manufacturing method thereof.
Figure 6:
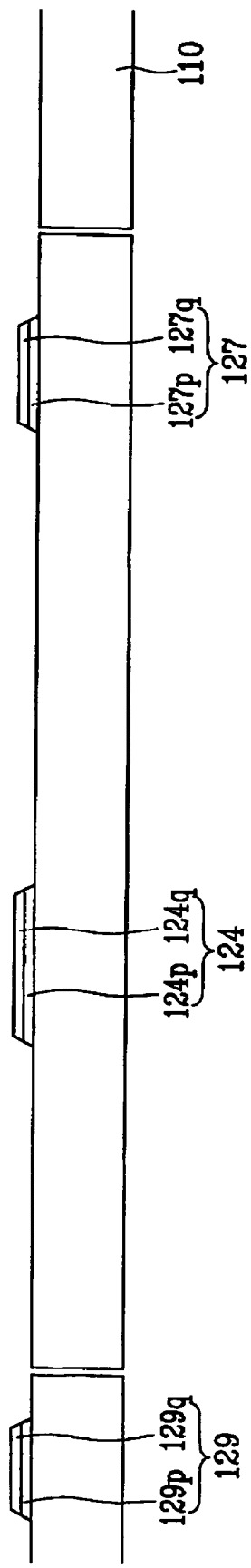

Referring to FIG. 5A and FIG. 5B, the photoresist film 40 is developed to form a plurality of masking members 42. The upper film 120q and the lower film 120p are etched by a common etchant to form a plurality of gate lines 121, which include gate electrodes 124, projections 127, and end portions 129.

The common etchant may include appropriate proportions of a phosphoric acid ($H_3PO_4$), a nitric acid ($HNO_3$), an acetic acid ($CH_3COOH$), and deionized water.

Referring to FIG. 6, the masking members 42 are removed. The masking members 42 may be removed by using a photoresist stripper.

Figure 7A:
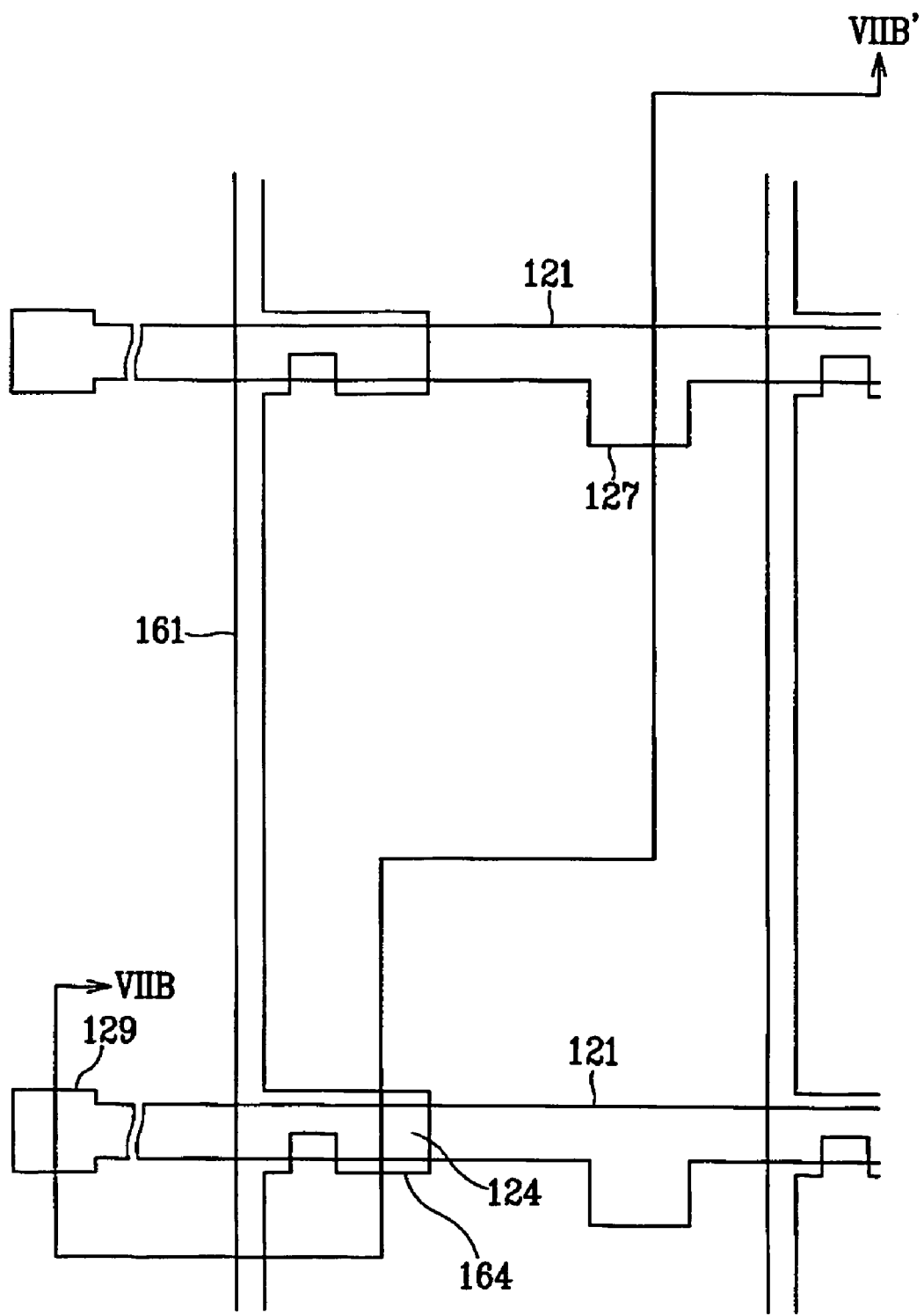
Figure 7B:
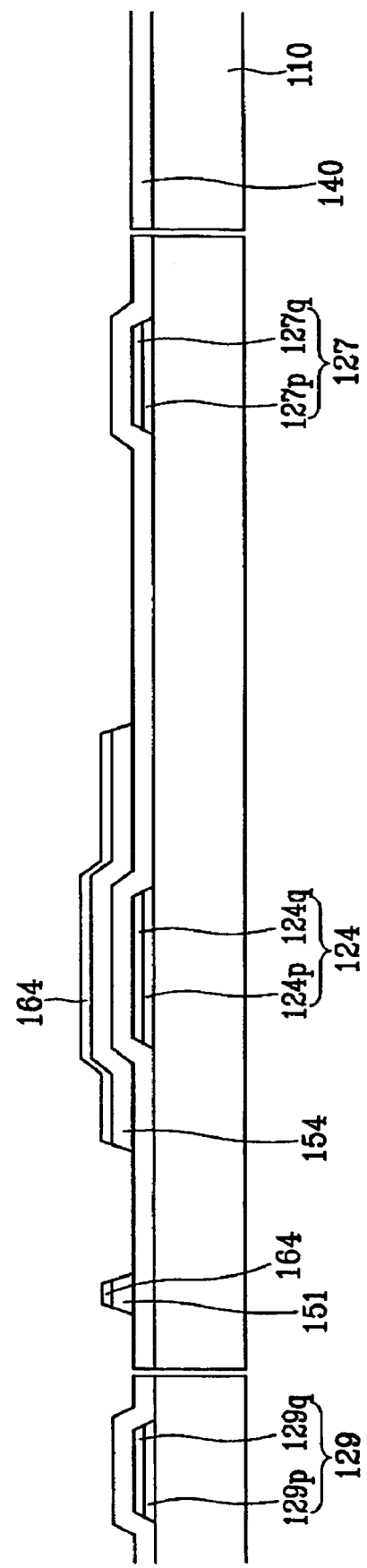
FIG. 7B is a sectional view of the TFT array panel shown in FIG. 7A taken along line VIIB-VIIB'.
Figure 8:
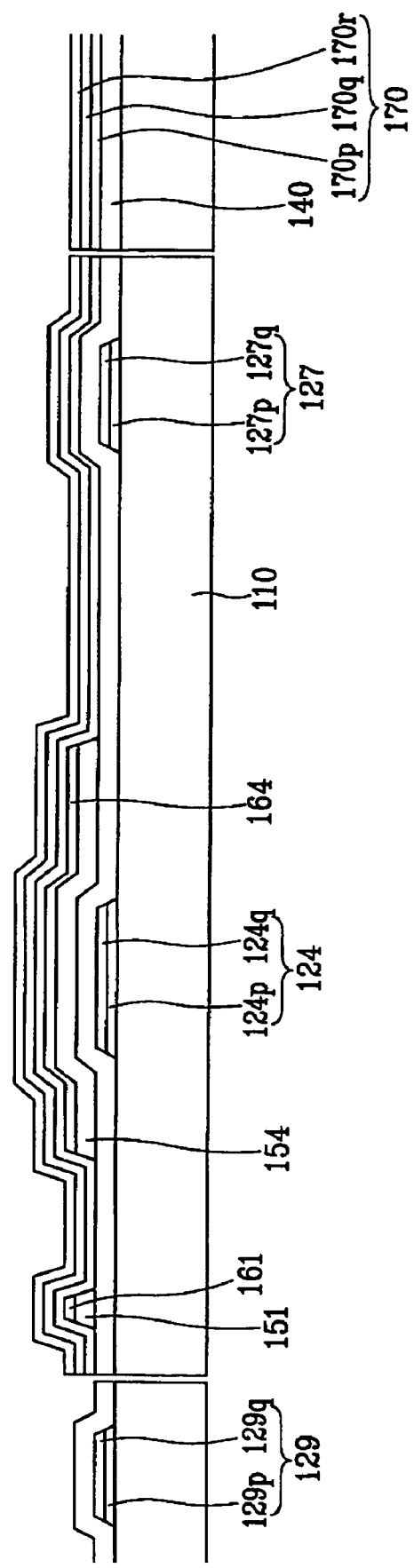

Referring to FIG. 7A and FIG. 7B, a gate insulating layer 140 that is approximately 2,000 Å to 5,000 Å thick is deposited at a temperature ranging from approximately 250° C. to 500° C.

An intrinsic amorphous silicon layer and an extrinsic amorphous silicon layer are then sequentially deposited on the gate insulating layer 140 and patterned by lithography and etching to form a plurality of extrinsic semiconductor stripes 164 and a plurality of intrinsic semiconductor stripes 151 including projections 154.

Referring to FIG. 8, a conductive layer 170 may be deposited on the gate insulating layer by, for example, sputtering, etc. The conductive layer 170 includes multiple film layers, for example a lower film 170p, which may be made of Mo, an intermediate film 170q, which may be made of Al, and an upper film 170r, which may be made of Mo. The conductive layer 170 is approximately 3,000 Å thick and the sputtering is performed at a temperature of approximately 150° C.

Referring to FIG. 9, a photoresist film 44 is deposited on the conductive layer. For example, the photoresist film 44 may be spin-coated on the upper film 170r. The photoresist film 44 may be made of a photoresist composition that is the same or substantially the same as the photoresist composition discussed and shown above with respect to FIG. 4.

In the photoresist composition, the weight percentage of the novolac resin may range from approximately 5 to 50 wt %. The weight percentage of the sensitizer may range from approximately 3 to 20 wt %. The weight percentage of the mercapto compound may range from approximately 0.5 to 15 wt %. The remaining percentage of the photoresist composition is the solvent.

Referring to FIG. 9, the photoresist film 44 may be exposed to light through a mask 51.

Figure 10A:
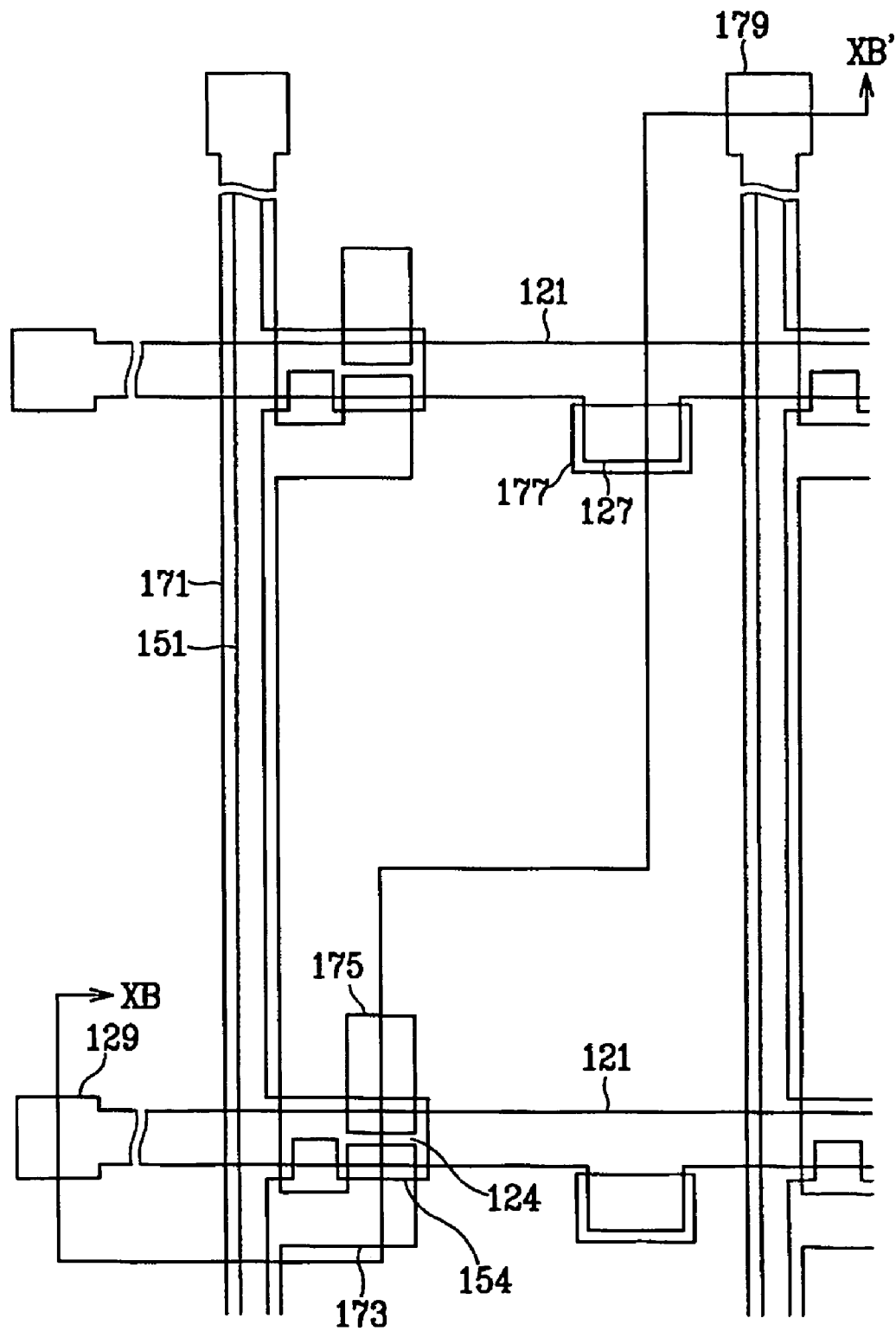
Figure 10B:
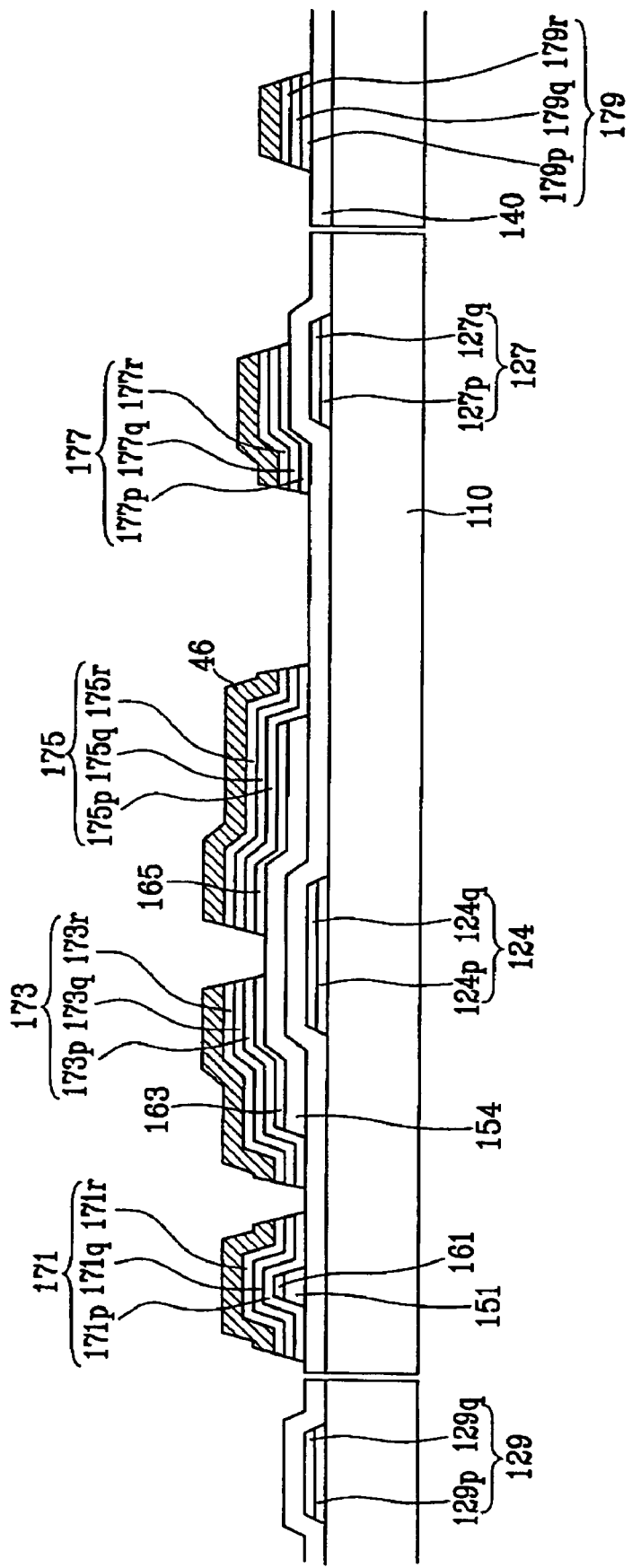
FIG. 10B and FIG. 11 are sectional views of the TFT array panel shown in FIG. 10A taken along line XB-XB'.
Figure 11:
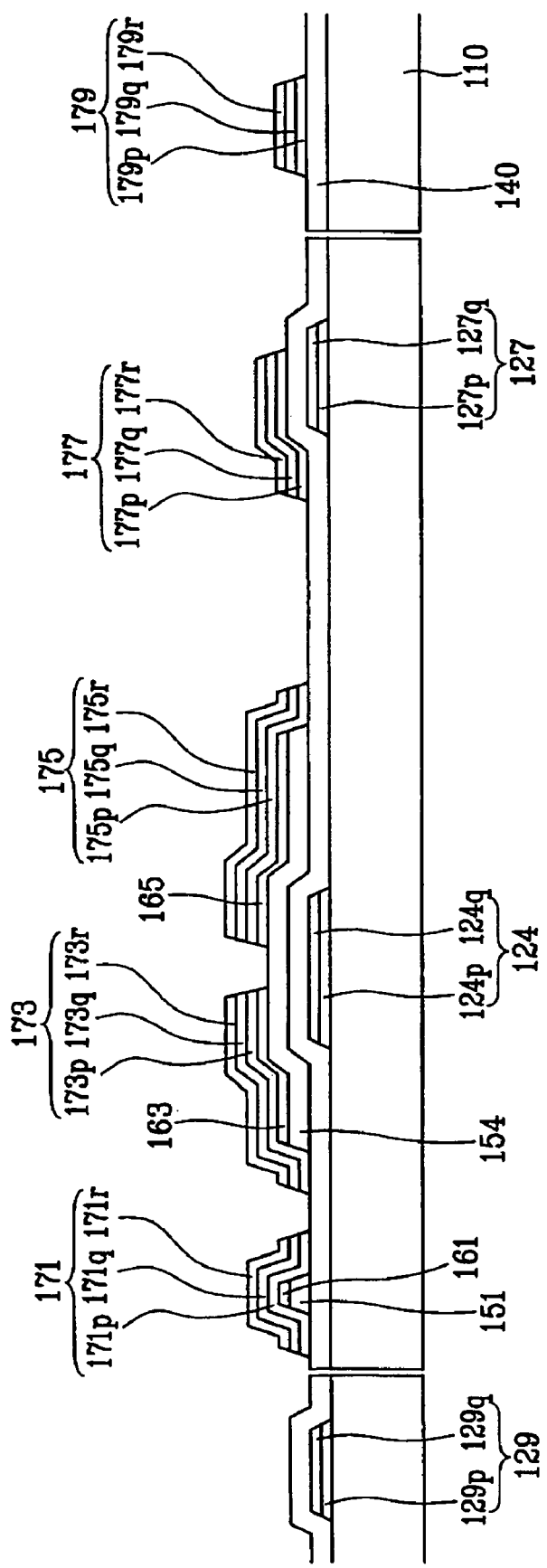

Referring to FIG. 10A and FIG. 10B, the photoresist film 44 is developed to form a plurality of masking members 46. The upper, the intermediate, and the lower films 170r, 170q and 170p (shown in FIG. 9) may be etched by a common etchant to form a plurality of data lines 171 including source electrodes 173 and end portions 179, the drain electrodes 175, and the storage conductors 177. The common etchant may include appropriate proportions of a phosphoric acid, a nitric acid, an acetic acid, and deionized water.

Referring to FIG. 11, each of the masking members 46 is removed. For example, each of the masking members 46 may be removed using a photoresist stripper.

Exposed portions of the extrinsic semiconductor stripes 164, which are not covered with the data lines 171, the drain electrodes 175, and the storage conductors 177, are removed to complete a plurality of ohmic contact stripes 161 including projections 163 and a plurality of ohmic contact islands 165 and to expose portions of the intrinsic semiconductor stripes 151. Oxygen plasma treatment may then be performed to stabilize the exposed surfaces of the semiconductor stripes 151.

Figure 12A:
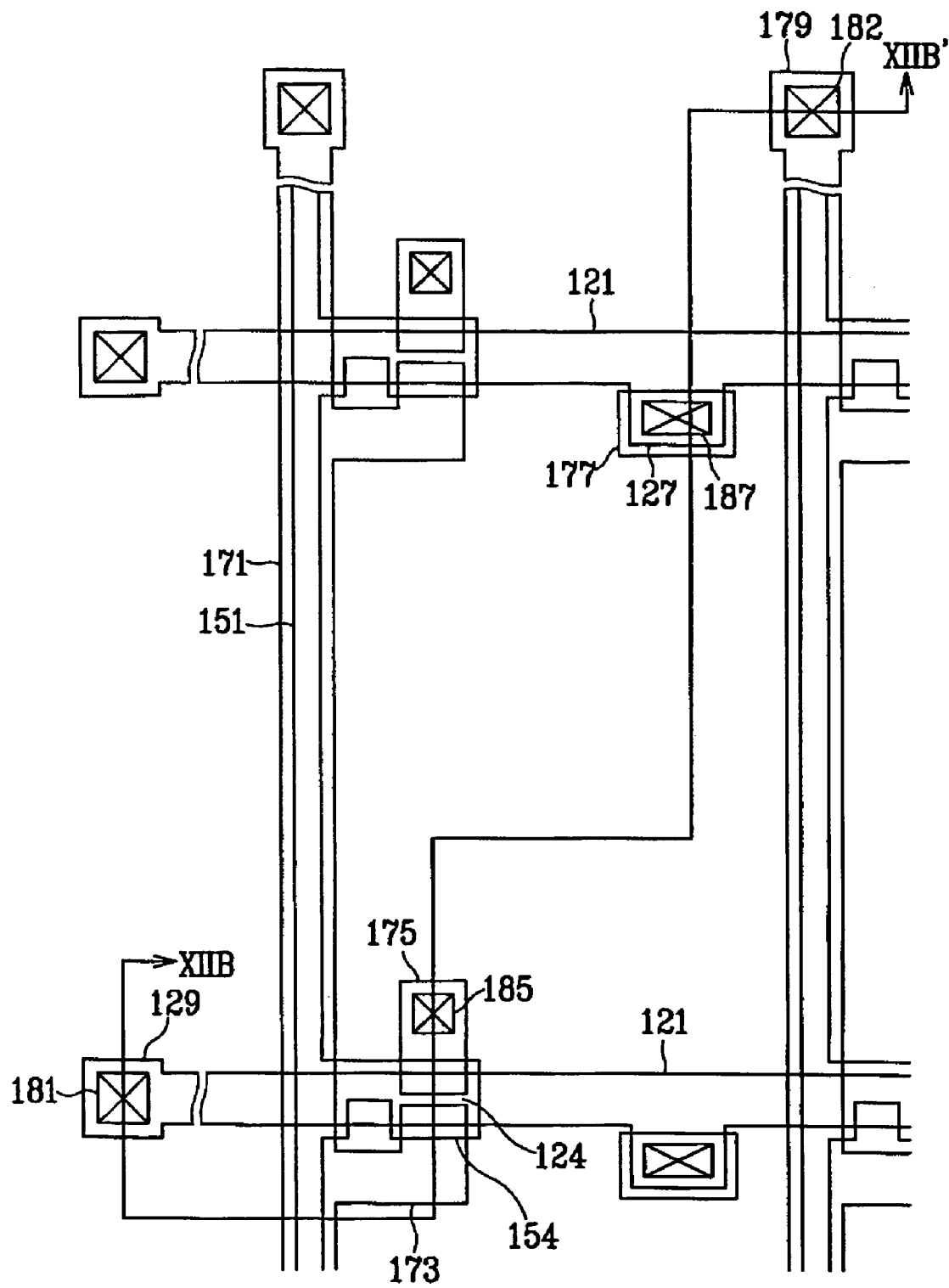
Figure 12B:
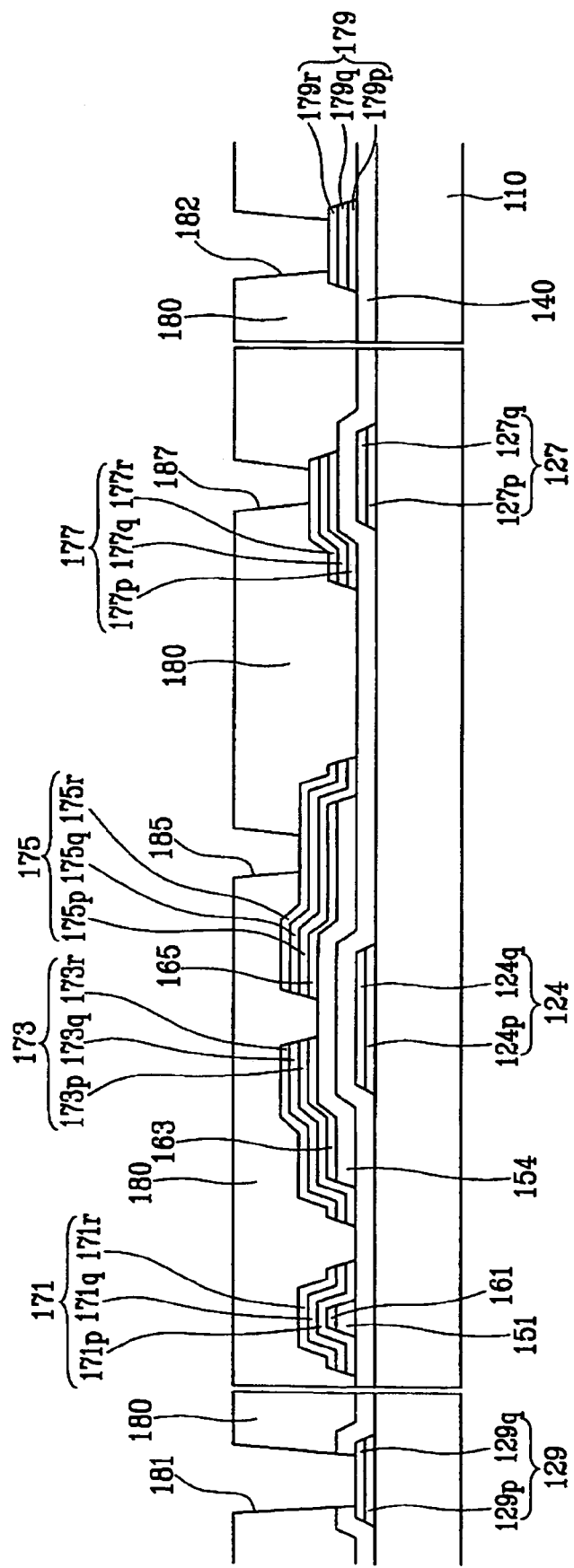
FIG. 12B is a sectional view of the TFT array panel shown in FIG. 12A taken along line XIIB-XIIB'.

Referring to FIG. 12A and FIG. 12B, a passivation layer 180 is then deposited on the substrate. The passivation layer 180 and the gate insulating layer 140 may be patterned by a lithography and etching process to form a plurality of contact holes 181, 182, 185 and 187. Alternatively, the passivation layer 180 may be photosensitive and the contact holes 181, 182, 185 and 187 may be formed by a lithography without etching process.

A plurality of pixel electrodes 190 and a plurality of contact assistants 81 and 82 are then formed on the passivation layer 180 and on the exposed portions of the drain electrodes 175, the end portions 129 of the gate lines 121, and the end portions 179 of the data lines 171 by sputtering, lithography, and etching an IZO or ITO layer, as shown in FIG. 1 and FIG. 2.

It is understood that the above-described photoresist composition may be used for patterning any of the layers or films of the substrate, such as the semiconductor stripes 151, the ohmic contacts 161 and 165, the passivation layer 180, the gate insulating layer 140, and the pixel electrodes 190 and the contact assistants 81 and 82. Further, the above-described photoresist composition may be applied to any of thin films and in particular, to any of metal thin films.

Embodiment 3

A TFT array panel according to an embodiment of the invention is described with reference to FIG. 13 and FIG. 14.

Figure 13:
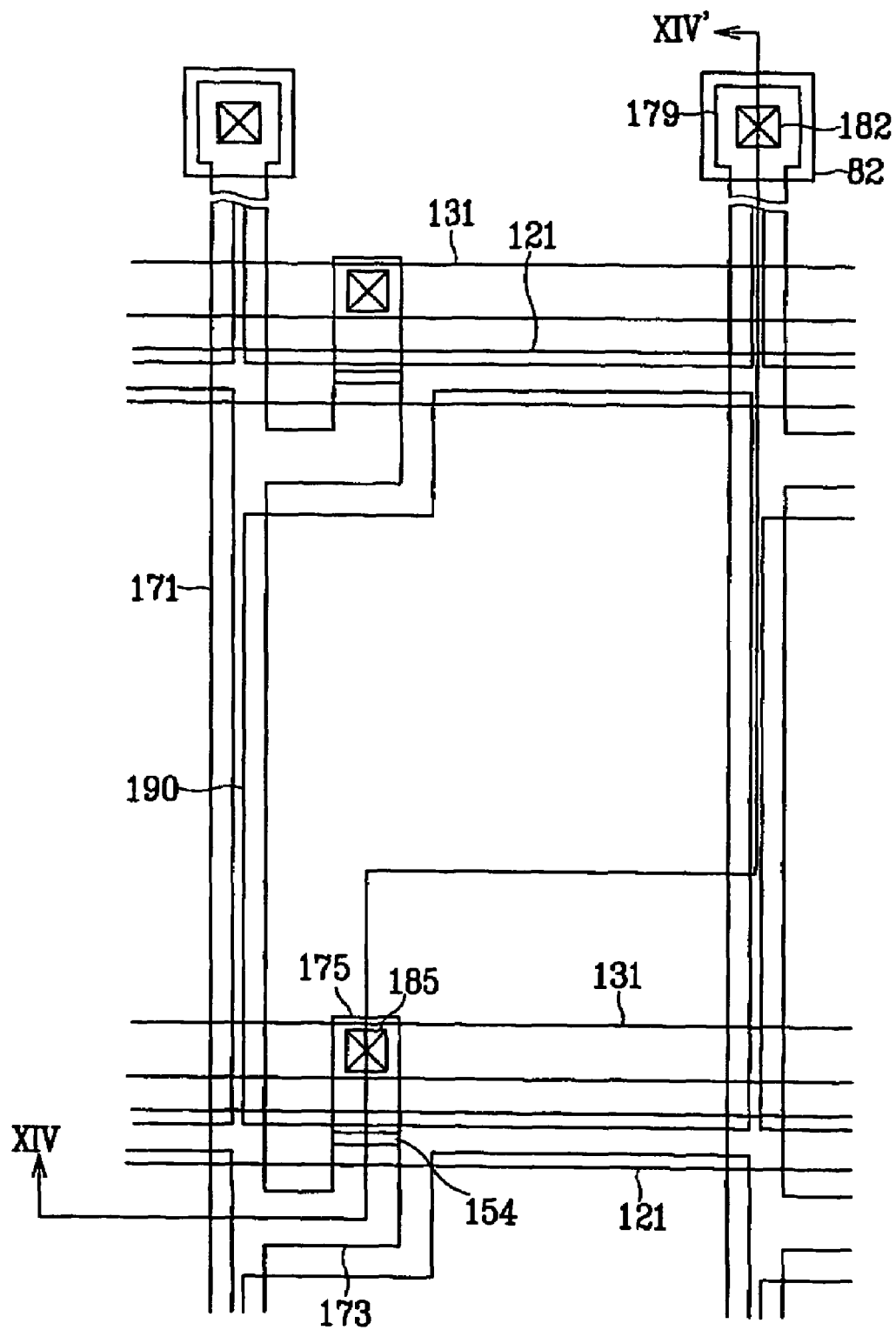
FIG. 13 is a layout view of a TFT array panel according to another embodiment of the invention.
Figure 14:
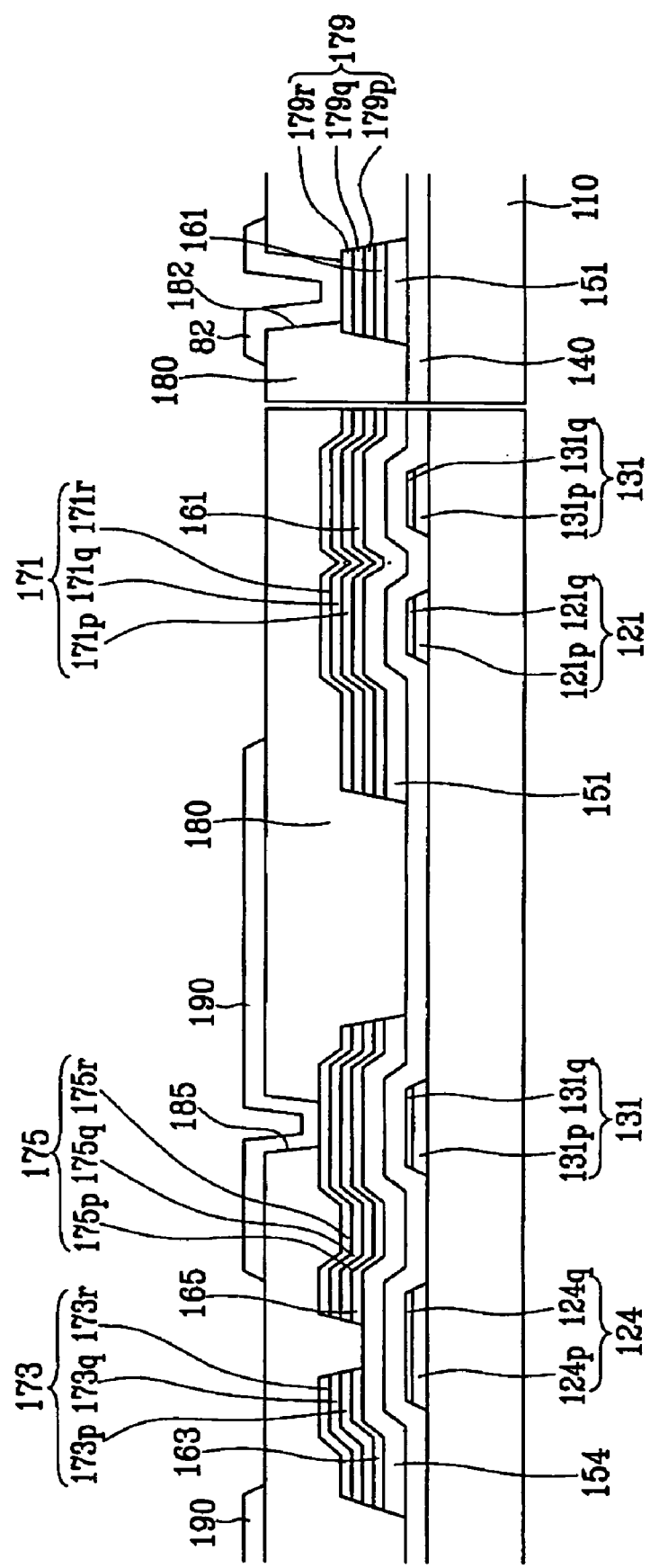
FIG. 14 is a sectional view of the TFT array panel shown in FIG. 13 taken along line XIV-XIV'.

FIG. 13 is a layout view of a TFT array panel and FIG. 14 is a sectional view of the TFT array panel shown in FIG. 13 taken along line XIV-XIV'.

A layered structure of the TFT array panel according to this embodiment is substantially similar to the structure shown in FIG. 1 and FIG. 2.

For example, a plurality of gate lines 121 including gate electrodes 124 are formed on a substrate 110. The gate lines 121 have lower films 121p and upper films 121q. Similarly, the gate electrodes 124 have lower films 124p and upper films 124q.

A gate insulating layer 140, a plurality of semiconductor stripes 151 including projections 154, and a plurality of ohmic contact stripes 161 including projections 163, and a plurality of ohmic contact islands 165 are formed on the gate lines 121 and the substrate 110, preferably sequentially.

A plurality of data lines 171, which include source electrodes 173, end portions 179, and a plurality of drain electrodes 175, are formed on the ohmic contacts 161 and 165. The data lines 171 and the drain electrodes 175 may have multiple film layers, such as lower films 171p and 175p, intermediate films 171q and 175q, and upper films 171r and 175r. Reference numerals 173p, 173q and 173r refer to lower, intermediate, and upper films of the source electrodes 173, respectively, and reference numerals 179p, 179q and 179r refer to lower, intermediate, and upper films of the end portions 179 of the data lines 171, respectively.

A passivation layer 180 is formed on the data lines 171, the drain electrodes 175, the semiconductor stripes 151, and the gate insulating layer 140, and a plurality of contact holes 182, 185 and 187 are provided at the passivation layer 180. A plurality of pixel electrodes 190 and a plurality of contact assistants 82 are formed on the passivation layer 180.

However, unlike the TFT array panel shown in FIG. 1 and FIG. 2, the TFT array panel according to the embodiment shown in FIGS. 13 and 14 provides a plurality of storage electrode lines 131, which are separated from the gate lines 121, on the same layer as the gate lines 121 without providing projections at the gate lines 121. The storage electrode lines 131 are supplied with a predetermined voltage and extend substantially parallel with the gate lines 121. Each of the storage electrode lines 131 is disposed between two adjacent gate lines 121 and near one of the two adjacent gate lines 121.

According to an embodiment of the invention, each of the storage electrode lines 131 is equidistant from the two adjacent gate lines 121. Further, the storage electrode lines 131 may be a dual-layered structure having a lower film 131p and an upper film 131q.

Without providing the storage capacitor conductors 177 shown in FIGS. 1 and 2, the drain electrodes 175 extend to overlap the storage electrode lines 131 to form storage capacitors. The storage electrode lines 131 may be omitted if the storage capacitance generated by the overlapping of the gate lines 121 and the pixel electrodes 190 is sufficient.

In addition, the semiconductor stripes 151 have substantially the same planar shapes as the data lines 171, the drain electrodes 175, and the underlying ohmic contacts 161 and 165. However, the projections 154 of the semiconductor stripes 151 include exposed portions, which are not covered with the data lines 171 and the drain electrodes 175, such as portions located between the source electrodes 173 and the drain electrodes 175.

A method of manufacturing the TFT array panel shown in FIG. 13 and FIG. 14 according to an embodiment of the invention is described with reference to FIGS. 13 through 23B.

Figure 15:
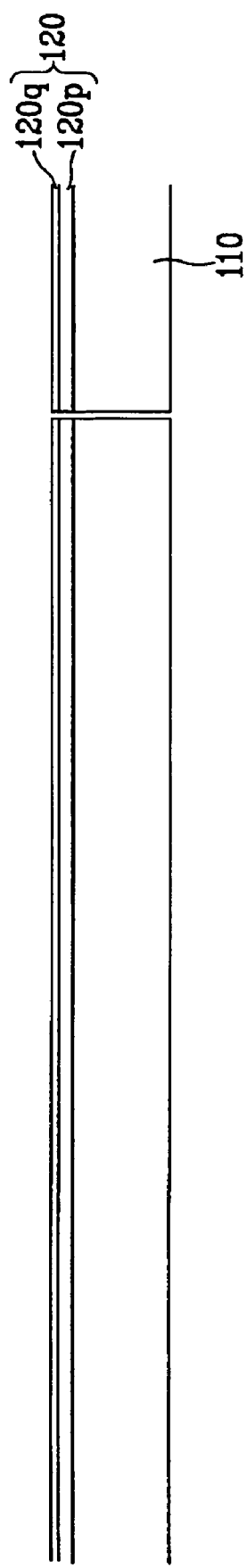
FIG. 15 and FIG. 16 are sectional views of the TFT array panel shown in FIG. 13 and FIG. 14 during the first two operations of a manufacturing method thereof according to an embodiment of the invention.
Figure 16:
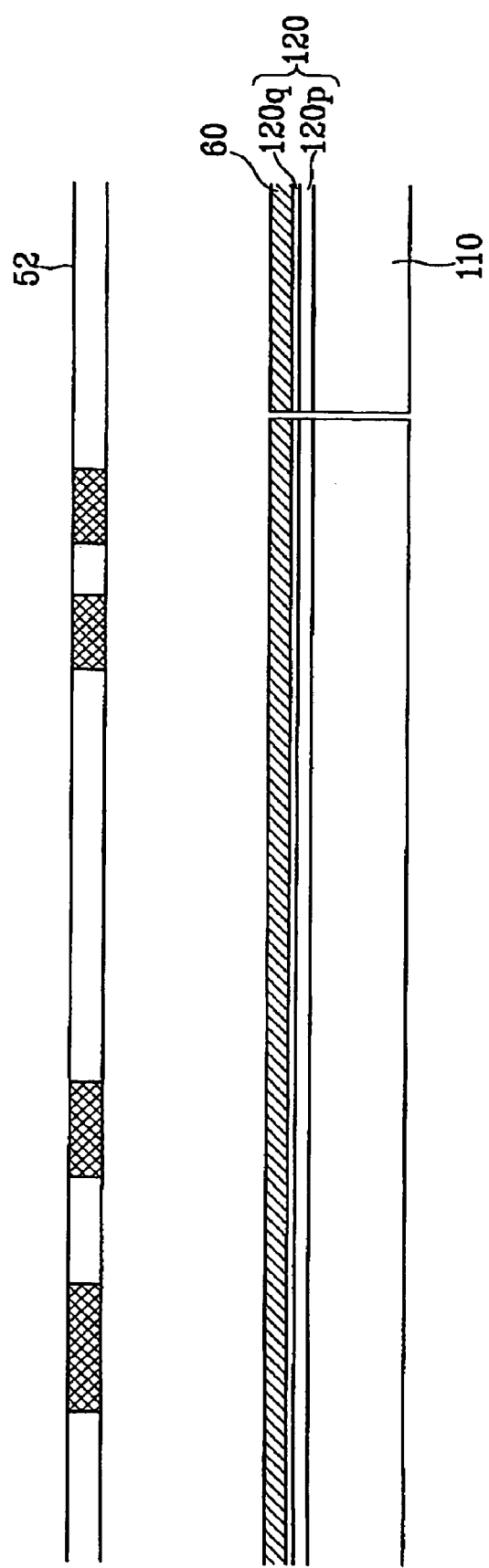
Figure 17A:
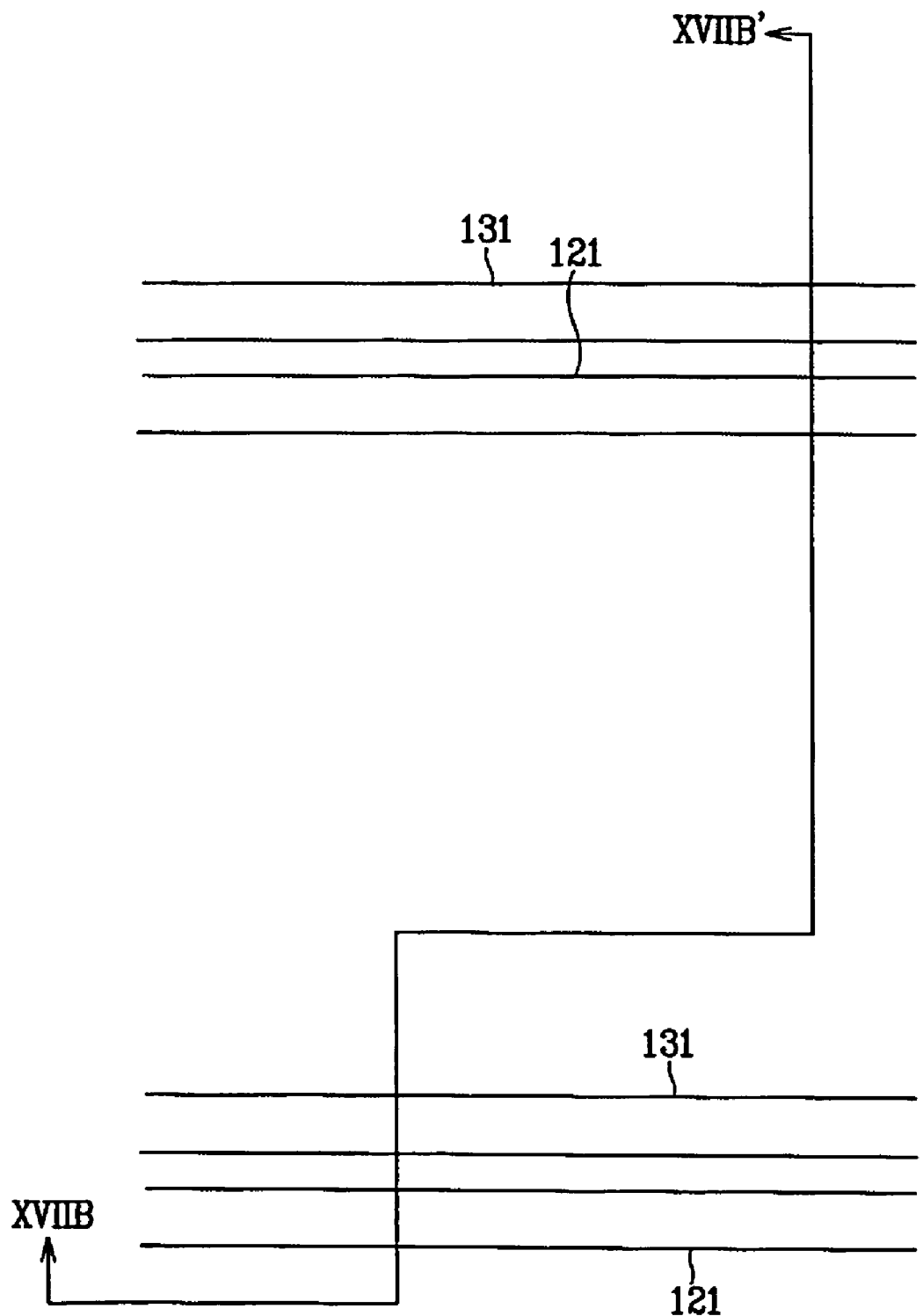
FIGS. 17A, 22A and 23A are layout views of a TFT array panel shown in FIGS. 1-2B during intermediate operations of the manufacturing method thereof.
Figure 22A:
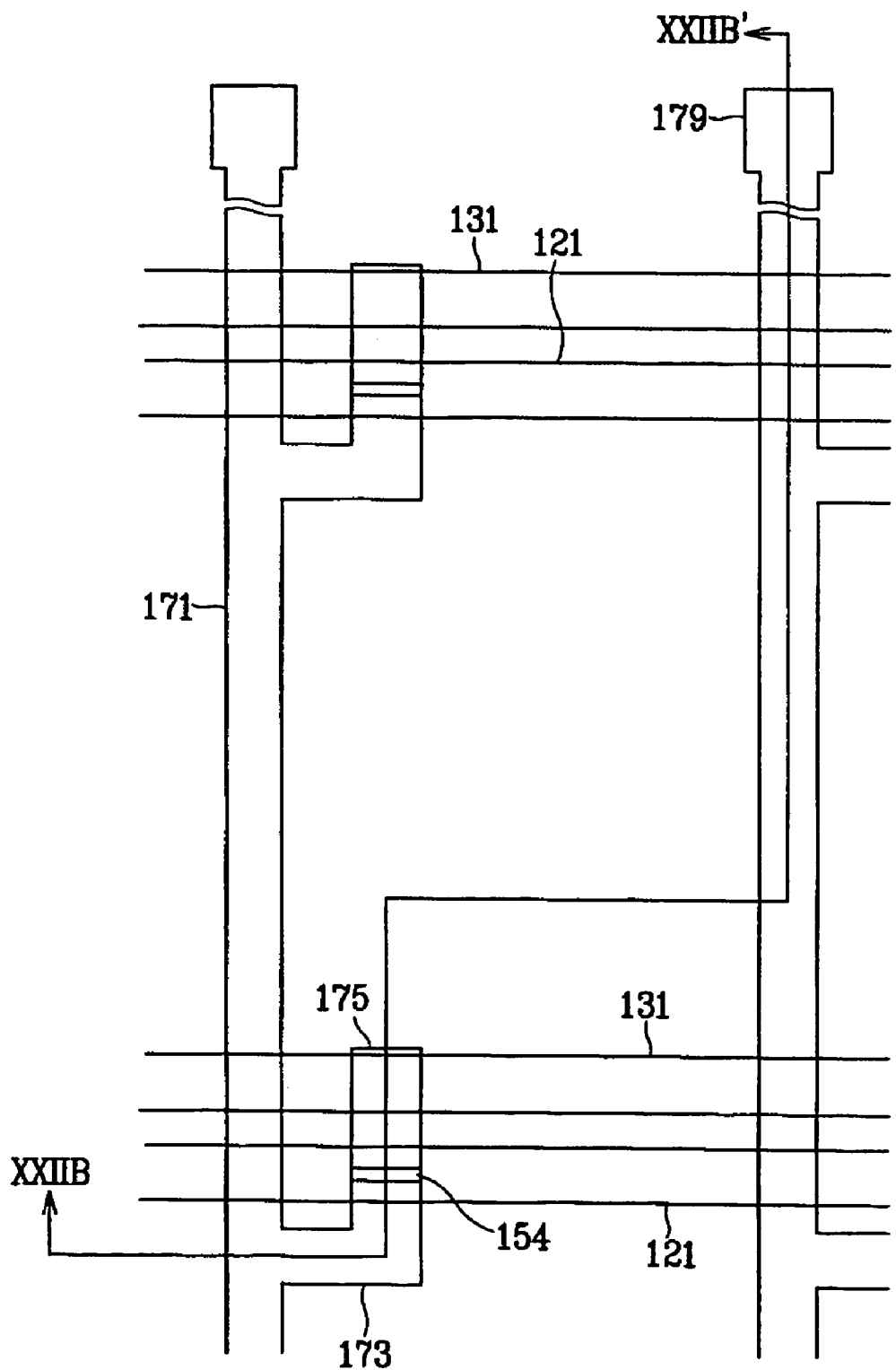
Figure 22B:
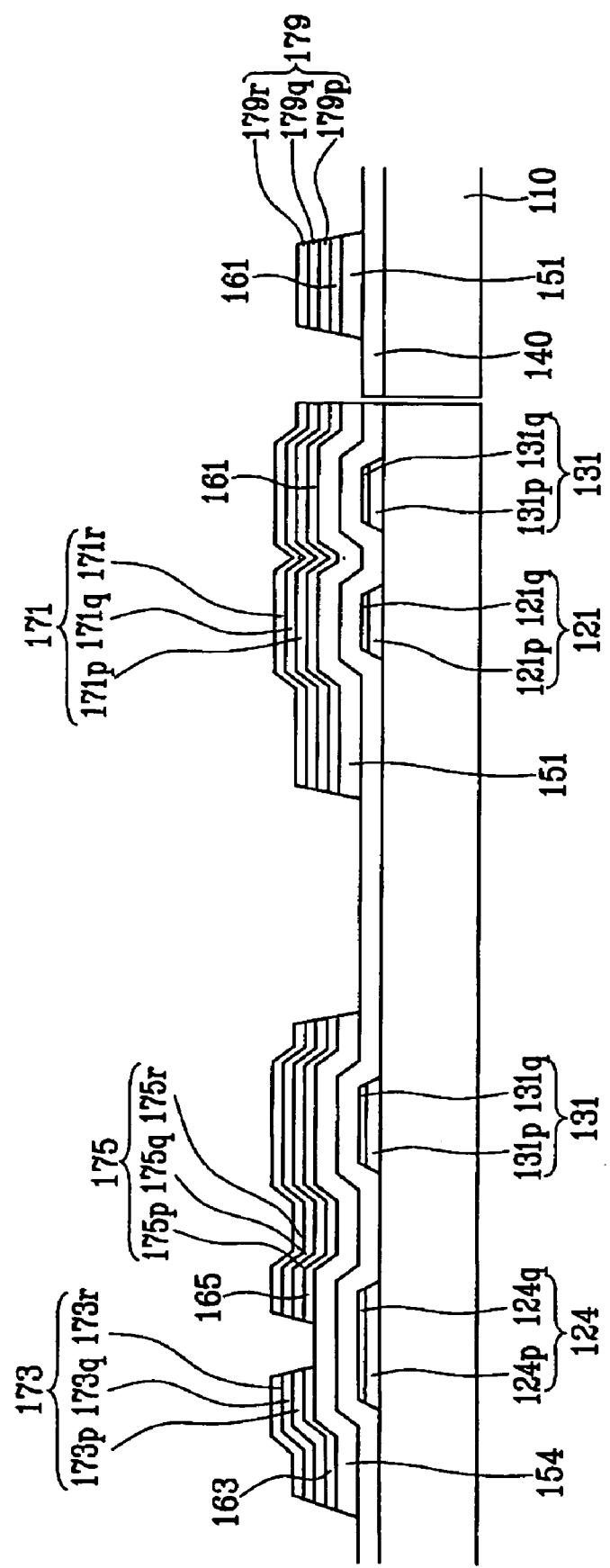
FIG. 22B and FIG. 23B are sectional views of the TFT array panel shown in FIG. 22A and FIG. 23A taken along lines XXIIB-XXIIB' and XXIIIB-XXIIIB', respectively.
Figure 23A:
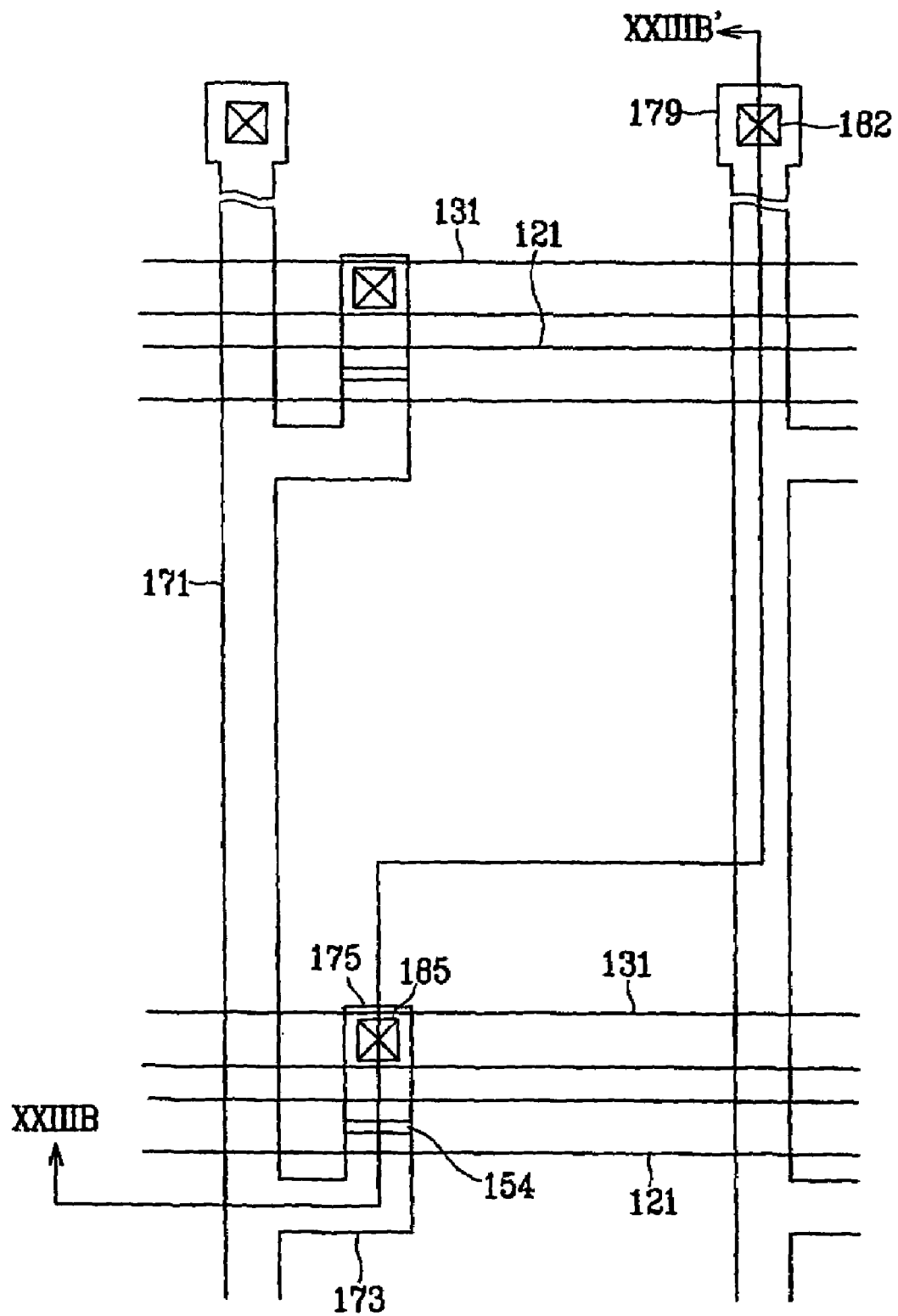
Figure 23B:
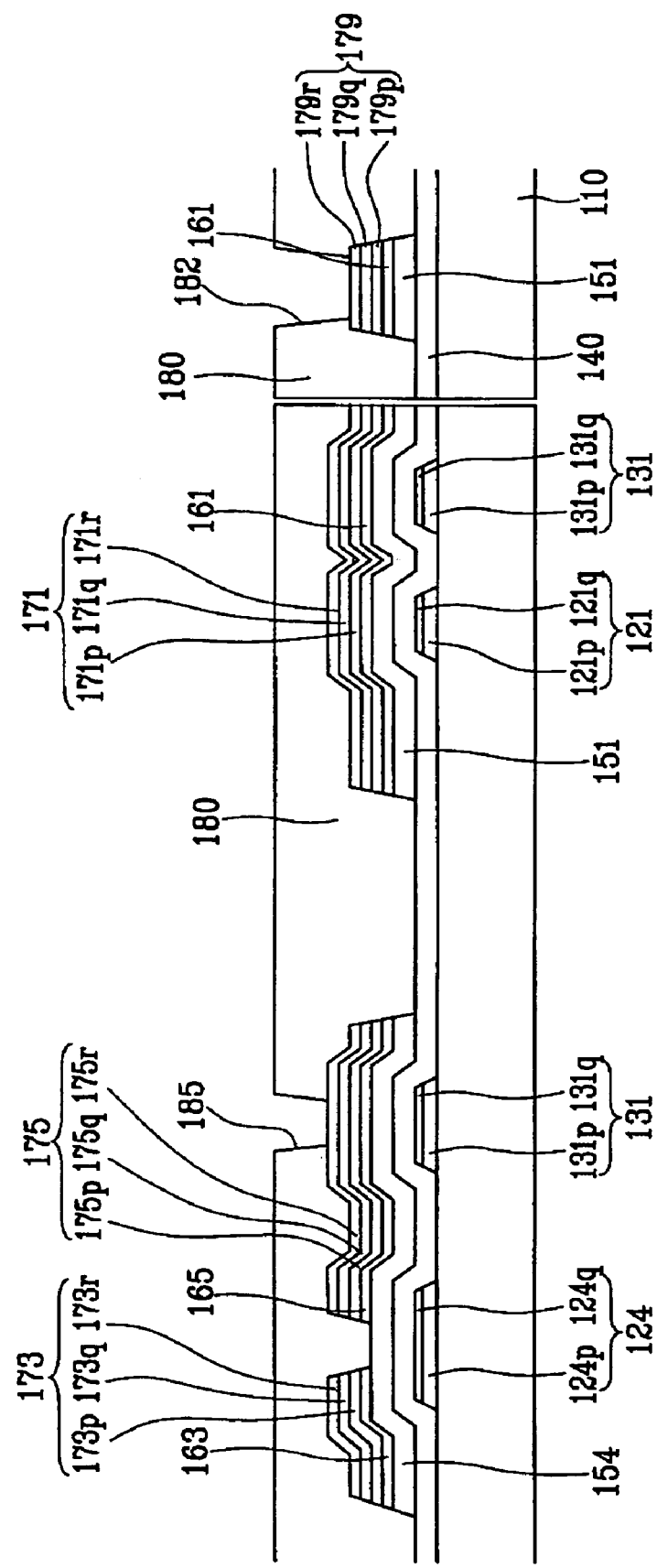

FIGS. 17A, 22A and 23A are layout views of a TFT array panel shown in FIGS. 1, 2A, and 2B during intermediate operations of a manufacturing method thereof according to an embodiment of the invention. FIG. 15 and FIG. 16 are sectional views of the TFT array panel shown in FIG. 13 and FIG. 14 during the first two operations of the manufacturing method. FIG. 17B is a sectional view of the TFT array panel shown in FIG. 17A taken along the lines XVIIB-XVIIB. FIGS. 18, 19, 20, and 21 are sectional views of the TFT array panel shown in FIG. 7A taken along the lines XVIIB-XVIIB' during the two operations following the operation shown in FIG. 17B. FIG. 22B and FIG. 23B are sectional views of the TFT array panel shown in FIG. 22A and FIG. 23A taken along lines XXIIB-XXIIB' and XXIIIB-XXIIIB', respectively.

Referring to FIG. 15, a conductive layer 120 is deposited on an insulating substrate 110, for example, by sputtering, etc. The conductive layer 120 has a lower film 120p, which may be made of Al or Al—Nd alloy and may be approximately 2,500 Å thick, and an upper film 120q, which may be made of Mo.

Referring to FIG. 16, a photoresist film 60 may be spin-coated on the upper film 120q. The photoresist film 60 may be made of a photoresist composition that is the same or substantially the same as the photoresist composition discussed and shown above with respect to FIG. 4 and FIG. 9.

In the photoresist composition, the weight percentage of the novolac resin may range from approximately 5 to 50 wt %. The weight percentage of the sensitizer may range from approximately 3 to 20 wt %. The weight percentage of the mercapto compound may range from approximately 0.5 to 15 wt %. The remaining portion of the photoresist composition includes the solvent.

Referring to FIG. 16, the photoresist film 60 is exposed to light through the mask 52.

Referring to FIG. 17A and FIG. 17B, the photoresist film 60 is developed to form a plurality of masking members 62. The upper film 120q and the lower film 120p may be etched by a common etchant to form a plurality of gate lines 121, gate electrodes 124, end portions 129, and a plurality of storage electrode lines 131.

The common etchant may include appropriate proportions of a phosphoric acid ($H_3PO_4$), a nitric acid ($HNO_3$), an acetic acid ($CH_3COOH$), and deionized water.

Figure 18:
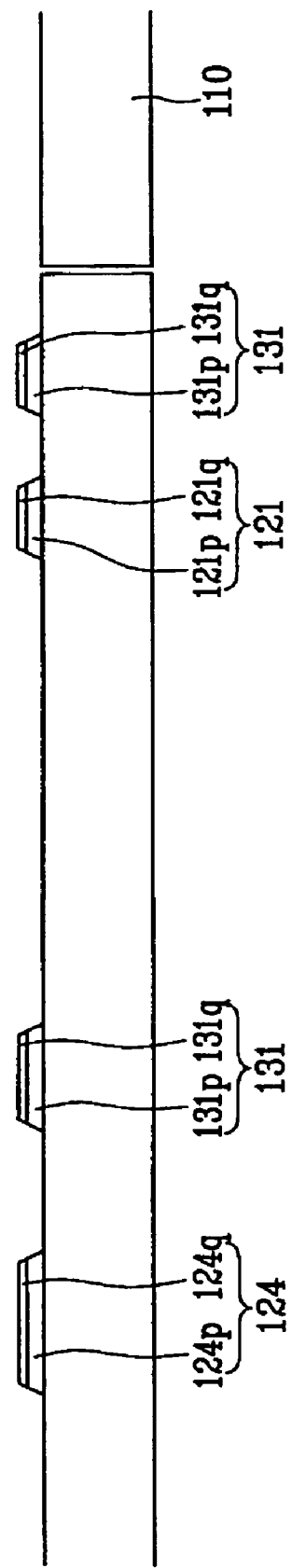

Referring to FIG. 18, the masking members 62 may be removed by using a photoresist stripper.

Figure 19:
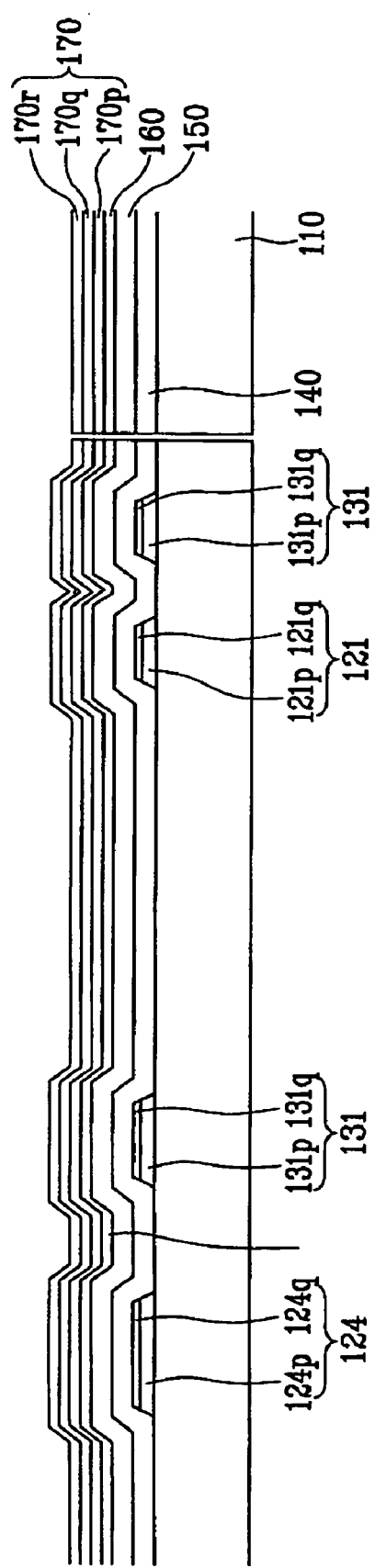

Referring to FIG. 19, a gate insulating layer 140, an intrinsic a-Si layer 150, and an extrinsic a-Si layer 160 are sequentially deposited by CVD, etc. A conductive layer 170 is then deposited by sputtering, etc. The conductive layer 170 may include multiple film layers, for example a lower film 170p, which may be made of Mo, an intermediate film 170q, which may be made of Al, and an upper film 170r, which may be made of Mo.

A photoresist film is spin-coated on the upper film 170r. The photoresist film may be made of a photoresist composition that is the same or substantially the same as the photoresist composition discussed and shown above with respect to FIGS. 4, 9, and 16.

In the photoresist composition, the weight percentage of the novolac resin ranges from approximately 5 to 50 wt %. The weight percentage of the sensitizer ranges from approximately 3 to 20 wt %. The weight percentage of the mercapto compound ranges from approximately 0.5 to 15 wt %. The remaining portion of the photoresist composition may be the solvent.

Figure 20:
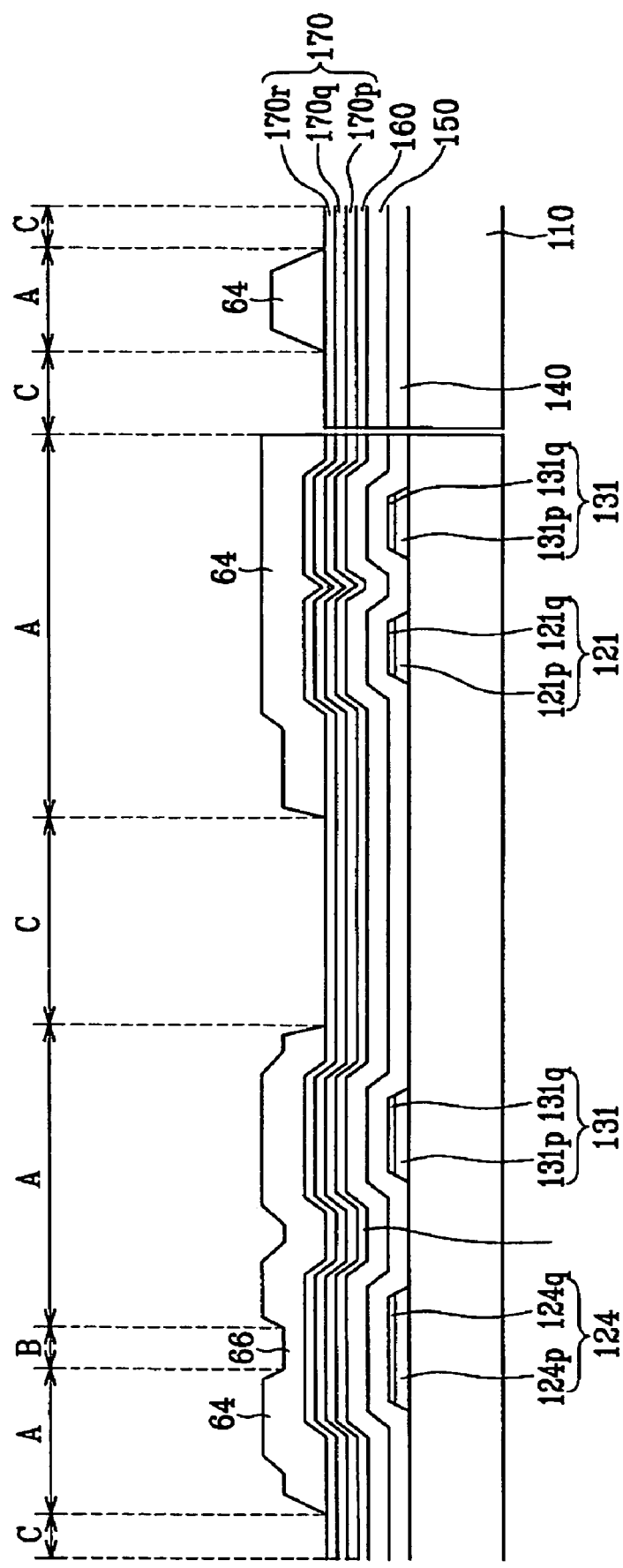

The photoresist film is exposed to light through a photo mask (not shown), and developed to form a plurality of masking members 64 and 66 such that the masking members 64 and 66 have a position dependent thickness. The masking members 64 and 66 shown in FIG. 20 may include a plurality of portions, each having a different thickness. For example, as shown in FIG. 20, first portions are located on wire areas A, which are indicated as reference numeral 64, and the second portions are located on channel areas B, which are indicated by reference numeral 66. No reference numeral is assigned to third portions, which are located on the remaining areas C, since the third portions have substantially zero thickness and expose underlying portions of the conductive layer 170.

The thickness ratio of the second portions 66 to the first portions 64 is adjusted depending upon the process conditions in the following process operations. According to an embodiment of the invention, the thickness of the second portions 66 is equal to or less than half of the thickness of the first portions 64.

The position-dependent thickness of the masking members 64 and 66 is obtained by several techniques. For example, the position-dependent thickness of the masking members 64 and 66 may be obtained by providing translucent areas, and/or light transmitting areas, and/or light blocking opaque areas on the exposure mask. The translucent areas may have various patterns, such as a slit pattern, a lattice pattern, a thin film(s) with intermediate transmittance or intermediate thickness, etc. When using a slit pattern, the width of the slits or the distance between the slits depends on the resolution of a light exposer used for the photolithography.

The different thickness of the masking members 64 and 66 enables the underlying layers to be selectively etched when using suitable process conditions. Therefore, a plurality of data lines 171 including source electrodes 173 and end portion 179, a plurality of drain electrodes 175, a plurality of ohmic contact stripes 161 including projections 163, a plurality of ohmic contact islands 165, and a plurality of semiconductor stripes 151 including projections 154 are obtained as shown in FIGS. 22A and 22B by a series of etching operations.

For descriptive purpose, portions of the conductive layer 170, the extrinsic a-Si layer 160, and the intrinsic a-Si layer 150 on the wire areas A are referred to as first portions. Portions of the conductive layer 170, the extrinsic a-Si layer 160, and the intrinsic a-Si layer 150 on the channel areas B are referred to as second portions. Portions of the conductive layer 170, the extrinsic a-Si layer 160, and the intrinsic a-Si layer 150 on the remaining areas C are referred to as third portions.

A method of forming the above-described and shown structure according to an embodiment of the invention is described below.

The third portions of the conductive layer 170, the extrinsic a-Si layer 160 and the intrinsic a-Si layer 150 on the remaining areas C are removed.

The second portions 66 of the masking members are then removed.

The second portions of the conductive layer 170 and the extrinsic a-Si layer 160 on the channel areas B are then removed.

The first portions 64 of the masking members are then removed.

FIG. 21 shows the TFT array panel right after the third portions of the conductive layer 170, the extrinsic a-Si layer 160 and the intrinsic a-Si layer 150 on the remaining areas C are removed. Reference numeral 174 refers to conductors formed by removing the second portions of the conductive layer 170, and reference numerals 174p, 174q and 174r are lower, intermediate, and upper films of the conductors 174, respectively.

The third portions of the conductive layer 170 may be removed by a wet etch process. The third portions of the extrinsic a-Si layer 160 and the intrinsic a-Si layer 150 may be removed by a dry etch process. It is understood that each of the third portions is not limited to the above described processes.

The third portions of the extrinsic a-Si layer 160 and the intrinsic a-Si layer 150 and the second portions 66 of the photoresist may be simultaneously removed.

The removal of the second portions 66 of the masking members may decrease the thickness of the first portions 64 of the masking members. The photoresist remnant that may remain on the second portions of the conductive layer 170, after the second portions 66 of the masking members are removed, may be removed by ashing, etc.

The removal of the first portions 64 of the masking members may be performed using a photoresist stripper.

A method of forming the above-described and shown structure according to another embodiment of the invention is described below.

The third portions of the conductive layer 170 are removed.

The second portions 66 of the masking members are then removed.

The third portions of the extrinsic a-Si layer 160 and the intrinsic a-Si layer 150 are then removed.

The second portions of the conductive layer 170 are removed.

The first portions 64 of the masking members are then removed.

The second portions of the extrinsic a-Si layer 160 are then removed.

Referring to FIG. 23A and FIG. 23B, a passivation layer 180 is deposited and the passivation layer 180 and the gate insulating layer 140 are patterned by a lithography and etching process to form a plurality of contact holes 181, 182, 185 and 187. Alternatively, the passivation layer 180 may be photosensitive and the contact holes 181, 182, 185 and 187 may be formed by a lithography without etching process.

A plurality of pixel electrodes 190 and a plurality of contact assistants 81 and 82 are then formed on the passivation layer 180 and on the exposed portions of the drain electrodes 175, the end portions 129 of the gate lines 121, and the end portions 179 of the data lines 171 by sputtering, lithography, and etching an IZO or ITO layer as shown FIG. 1 and FIG. 2.

The above-described photoresist composition may be used for patterning any of the layers or films such as the semiconductor stripes 151, the ohmic contacts 161 and 165, the passivation layer 180, the gate insulating layer 140, and the pixel electrodes 190 and the contact assistants 81 and 82. Furthermore, the above-described photoresist composition may be applied to any of thin films and in particular, to any of metal thin films.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A photoresist composition, comprising:
    a novolac resin having

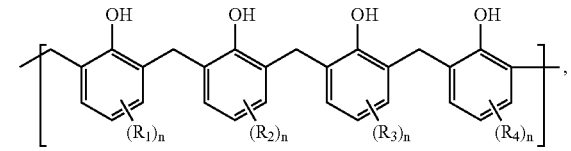

where each of $R_1$, $R_2$, $R_3$, and $R_4$ is a hydrogen atom or an alkyl group containing one through six carbon atoms and n is an integer ranging from zero through three; and
    a mercapto compound having $Z_1$-SH, or

SH-$Z_2$-SH, where each of $Z_1$ and $Z_2$ is an alkyl group or an alkyl group containing one through twenty carbon atoms,
    a sensitizer, and
    a solvent.

2. The composition of claim 1, wherein the weight percentage of the novolac resin ranges from approximately 5 through 50 wt %, the weight percentage of the sensitizer ranges from approximately 3 through 20 wt %, and the weight percentage of the mercapto compound ranges from approximately 0.5 through 15 wt %, and the remaining percentage of the photoresist composition is the solvent.

3. The composition of claim 1, wherein the mercapto compound is at least one compound selected from a group consisting of 2-mercapto toluene, 3- mercapto toluene, 4- mercapto toluene, ethyl ester 3-mercapto propionate, methyl ester 3-mercapto propionate, 3- mercapto propyl dimethoxy methyl silane, 3-mercapto propyl trimethoxy silane, 2-mercapto ethyl sulfide, 2-mercapto pyrimidine, 2-mercapto-4-pyrimidone, 2-mercapto-para-xylene, 4- mercapto-meta-xylene, and 1 -dodecyl mercaptan.

4. The composition of claim 1, wherein the photoresist composition further comprises:
    a silicone compound comprising at an epoxy group and/or an amine group.

5. The composition of claim 2, wherein the mercapto compound is at least one compound selected from a group consisting of 2-mercapto toluene, 3-mercapto toluene, 4-mercapto toluene, ethyl ester 3-mercapto propionate, methyl ester 3-mercapto propionate, 3-mercapto propyl dimethoxy methyl silane, 3-mercapto propyl trimethoxy silane, 2-mercapto ethyl sulfide, 2-mercapto pyrimidine, 2-mercapto-4-pyrimidone, 2-mercapto-para-xylene, 4-mercapto-meta-xylene, and 1-dodecyl mercaptan.

6. The composition of claim 2, wherein the photoresist composition further comprises:
a silicone compound comprising at an epoxy group and/or an amine group.

7. The composition of claim 5, wherein the photoresist composition further comprises:
a silicone compound comprising at an epoxy group and/or an amine group.

8. The composition of claim 7, wherein the silicone compound is at least one compound selected from a group consisting of (3-glycide oxypropyl)trimethoxy silane, (3-glycide oxypropyl)triethoxy silane, (3-glycide oxypropyl)methyl dimethoxy silane, (3-glycide oxypropyl)methyl diethoxy silane, (3-glycide oxypropyl)dimethyl methoxy silane, (3-glycide oxypropyl)dimethyl ethoxy silane, 3,4-epoxy butyl trimethoxy silane, 3,4-epoxy butyl triethoxy silane, 2-(3,4-epoxy cyclohexyl)ethyl trimethoxy silane, 2-(3,4-epoxy cyclohexyl)ethyl triethoxy silane, and aminopropyl trimethoxy silane.

9. A method of forming a film pattern, comprising:
depositing a conductive or nonconductive film on a substrate;
coating a photoresist composition on the substrate;
exposing the photoresist composition to light to form a masking member; and
etching the thin film using the masking members,
wherein the photoresist comprises:
a novolac resin comprising:

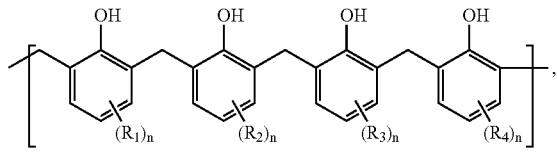

where each of $R_1$, $R_2$, $R_3$, and $R_4$ is a hydrogen atom or an alkyl group containing one through six carbon atoms and n is an integer ranging from zero through three,
a mercapto compound having $Z_1$-SH, or

SH-$Z_2$-SH, where each of $Z_1$ and $Z_2$ is an alkyl group or alkyl group containing one through twenty carbon atoms,
a sensitizer, and
a solvent.

10. The method of claim 9, wherein the weight percentage of the novolac resin ranges from approximately 5 through 50 wt %, the weight percentage of the sensitizer ranges from approximately 3 through 20 wt %, and the weight percentage of the mercapto compound ranges from approximately 0.5 through 15 wt %, and the remaining percentage of the photoresist composition is the solvent.

11. The composition of claim 9, wherein the silicone compound is at least one compound selected from a group consisting of (3-glycide oxypropyl)trimethoxy silane, (3-glycide oxypropyl)triethoxy silane, (3-glycide oxypropyl)methyl dimethoxy silane, (3-glycide oxypropyl)methyl diethoxy silane, (3-glycide oxypropyl)dimethyl methoxy silane, (3-glycide oxypropyl)dimethyl ethoxy silane, 3,4-epoxy butyl trimethoxy silane, 3,4-epoxy butyl triethoxy silane, 2-(3,4-epoxy cyclohexyl)ethyl trimethoxy silane, 2-(3,4-epoxy cyclohexyl)ethyl triethoxy silane, and aminopropyl trimethoxy silane.

12. A method of manufacturing a thin film transistor array panel, comprising:
forming a gate line comprising a gate electrode on a substrate;
forming a gate insulating layer on the gate line;
forming a semiconductor layer on the gate insulating layer;
forming a data line including a source electrode and a drain electrode on the semiconductor layer; and
forming a pixel electrode connected with the drain electrode,
wherein at least one of the formings comprises lithography and etching that comprises:
depositing a conductive or nonconductive film on a substrate;
coating a photoresist composition on the film;
exposing the photoresist composition to light and forming a masking member; and
etching the thin film using the masking member, and
wherein the photoresist composition comprises:
a novolac resin having

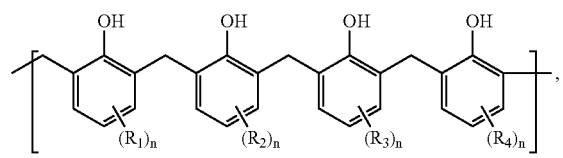

where each of $R_1$, $R_2$, $R_3$, and $R_4$ is a hydrogen atom or an alkyl group containing between one through six carbon atoms and n is an integer ranging from zero through three,
a mercapto compound having $Z_1$-SH, or

SH-$Z_2$-SH, where each of $Z_1$ and $Z_2$ is an alkyl group or alkyl group containing one through twenty carbon atoms,
a sensitizer, and
a solvent.

13. The method of claim 8, wherein the weight percentage of the novolac resin ranges from approximately 5 through 50 wt %, the weight percentage of the sensitizer ranges from approximately 3 through 20 wt %, and the weight percentage of the mercapto compound ranges from approximately 0.5 through 15 wt %, and the remaining percentage of the photoresist composition is the solvent.

14. The composition of claim 12, wherein the photoresist composition further comprises:
a silicone compound comprising at an epoxy group and/or an amine group.

15. The method of claim 9, further comprising:
performing a single lithography process to form the semiconductor layer, the data line, and the drain electrode.

16. The composition of claim 13, wherein the silicone compound is at least one compound selected from a group consisting of (3-glycide oxypropyl)trimethoxy silane, (3-glycide oxypropyl)triethoxy silane, (3-glycide oxypropyl)methyl dimethoxy silane, (3-glycide oxypropyl)methyl diethoxy silane, (3-glycide oxypropyl)dimethyl methoxy silane, (3-glycide oxypropyl)dimethyl ethoxy silane, 3,4-epoxy butyl trimethoxy silane, 3,4-epoxy butyl triethoxy silane, 2-(3,4-epoxy cyclohexyl)ethyl trimethoxy silane, 2-(3,4-epoxy cyclohexyl)ethyl triethoxy silane, and aminopropyl trimethoxy silane.

17. The method of claim 10, wherein the single lithography process is performed using a photoresist that comprises a first portion and a second portion that is thinner than the first portion.

18. The method of claim 11, further comprising:
disposing the first portion of the photoresist on the data line and the drain electrode; and
disposing the second portion of the photoresist between the source electrode and the drain electrode.

19. The composition of claim 17, wherein the silicone compound is at least one compound selected from a group consisting of (3-glycide oxypropyl)trimethoxy silane, (3-glycide oxypropyl)triethoxy silane, (3-glycide oxypropyl)methyl dimethoxy silane, (3-glycide oxypropyl)methyl diethoxy silane, (3-glycide oxypropyl)dimethyl methoxy silane, (3-glycide oxypropyl)dimethyl ethoxy silane, 3,4-epoxy butyl trimethoxy silane, 3,4-epoxy butyl triethoxy silane, 2-(3,4-epoxy cyclohexyl)ethyl trimethoxy silane, 2-(3,4-epoxy cyclohexyl)ethyl triethoxy silane, and aminopropyl trimethoxy silane.

* * * * *